US009666551B1

(12) United States Patent
Seo et al.

(10) Patent No.: US 9,666,551 B1
(45) Date of Patent: May 30, 2017

(54) SEMICONDUCTOR CHIP, SEMICONDUCTOR PACKAGE INCLUDING THE SAME, AND METHOD OF MANUFACTURING SEMICONDUCTOR CHIP

(71) Applicant: Samsung Electronics Co., Ltd., Suwon-si, Gyeonggi-do (KR)

(72) Inventors: Sun-kyoung Seo, Suwon-si (KR); Seung-kwan Ryu, Seongnam-si (KR); Cha-jea Jo, Yongin-si (KR); Tae-Je Cho, Yongin-si (KR)

(73) Assignee: Smasung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/236,814

(22) Filed: Aug. 15, 2016

(30) Foreign Application Priority Data

Dec. 9, 2015 (KR) .................... 10-2015-0175349

(51) Int. Cl.
*H01L 23/00* (2006.01)
*H01L 23/48* (2006.01)
(Continued)

(52) U.S. Cl.
CPC ........ *H01L 24/14* (2013.01); *H01L 21/76898* (2013.01); *H01L 23/481* (2013.01); *H01L 24/02* (2013.01); *H01L 24/03* (2013.01); *H01L 24/05* (2013.01); *H01L 24/11* (2013.01); *H01L 24/13* (2013.01); *H01L 25/0657* (2013.01); *H01L 25/50* (2013.01); *H01L 2224/02331* (2013.01); *H01L 2224/02372* (2013.01); *H01L 2224/0391* (2013.01); *H01L 2224/0401* (2013.01); *H01L 2224/05024* (2013.01); *H01L 2224/1162* (2013.01); *H01L 2224/11462* (2013.01); *H01L 2224/11849* (2013.01);
(Continued)

(58) Field of Classification Search
CPC ......... H01L 24/14; H01L 24/02; H01L 24/05; H01L 24/13
See application file for complete search history.

(56) References Cited

U.S. PATENT DOCUMENTS 5,468,994 A 11/1995 Pendse
6,521,914 B2 2/2003 Krames et al.
(Continued)

FOREIGN PATENT DOCUMENTS

JP 2003-297865 A 10/2003

*Primary Examiner* — Douglas Menz
(74) *Attorney, Agent, or Firm* — Harness, Dickey & Pierce, P.L.C.

(57) ABSTRACT

The semiconductor chip including a semiconductor device layer including a pad region and a cell region, a plurality of uppermost wirings formed on the semiconductor device layer to be arranged at an equal distance in the cell region, a passivation layer formed in the cell region and the pad region, and a plurality of thermal bumps disposed on the passivation layer to be electrically insulated from the plurality of uppermost wirings may be provided. The semiconductor device layer may include a plurality of through silicon via (TSV) structures in the pad region. The plurality of uppermost wirings may extend in parallel along one direction and have a same width. The passivation layer may cover at least a top surface of the plurality of uppermost wirings in the cell region and includes a top surface having a wave shape.

20 Claims, 21 Drawing Sheets

(51) Int. Cl.
*H01L 25/065* (2006.01)
*H01L 21/768* (2006.01)
*H01L 25/00* (2006.01)

(52) U.S. Cl.
CPC ............... *H01L 2224/13026* (2013.01); *H01L 2224/14519* (2013.01); *H01L 2225/06513* (2013.01); *H01L 2225/06544* (2013.01); *H01L 2225/06555* (2013.01); *H01L 2225/06582* (2013.01); *H01L 2225/06589* (2013.01)

(56) References Cited

U.S. PATENT DOCUMENTS

| | | |
|---|---|---|
| 6,661,093 B2 | 12/2003 | Ujiie et al. |
| 7,081,681 B2 | 7/2006 | Suzuki |
| 8,269,346 B2 | 9/2012 | Seta et al. |
| 8,742,499 B2 | 6/2014 | Nakajima et al. |
| 8,759,941 B2 | 6/2014 | Yokoyama |
| 2005/0104209 A1* | 5/2005 | Kang ............ H01L 23/13 257/737 |
| 2008/0001276 A1* | 1/2008 | Lee ............ H01L 23/3128 257/686 |
| 2008/0123386 A1* | 5/2008 | Kang ............ G11C 5/063 365/63 |
| 2011/0156232 A1* | 6/2011 | Youn ............ G11C 5/02 257/686 |

* cited by examiner

SEMICONDUCTOR CHIP, SEMICONDUCTOR PACKAGE INCLUDING THE SAME, AND METHOD OF MANUFACTURING SEMICONDUCTOR CHIP

CROSS-REFERENCE TO RELATED APPLICATION

This application claims under 35 U.S.C. §119 priority to Korean Patent Application No. 10-2015-0175349, filed on Dec. 9, 2015, in the Korean Intellectual Property Office, the disclosure of which is incorporated herein in its entirety by reference.

BACKGROUND

The inventive concepts relate to semiconductor chips, semiconductor packages including the same, and/or methods of manufacturing the semiconductor chips, and more particularly, to semiconductor chips having a through silicon via (TSV) structure, semiconductor packages including the same, and/or methods of manufacturing the semiconductor chips having the TSV structure.

As the electronic industry rapidly advances and user demands increase, electronic devices are becoming more and more miniaturized and lightened. Semiconductor packages applied to electronic devices should have relatively high performance and a relatively large capacity, in addition to miniaturization and lightness. Research and development are continuously being conducted on a semiconductor chip having a TSV structure and a semiconductor package including the same to realize such objectives.

SUMMARY

The inventive concepts provide semiconductor chips, semiconductor packages including the same, and/or methods of manufacturing the semiconductor chip, which realize relatively high performance and a relatively large capacity in addition to miniaturization and lightness.

According to an example embodiment of the inventive concepts, a semiconductor chip includes a semiconductor device layer including a pad region and a cell region, the semiconductor device layer including a plurality of through silicon via (TSV) structures in the pad region, a plurality of uppermost wirings on the semiconductor device layer, the plurality of uppermost wirings arranged at an equal distance in the cell region, the plurality of uppermost wirings having a same width and extending in parallel along one direction, a passivation layer in the cell region and the pad region, the passivation layer covering at least a top surface of the plurality of uppermost wirings in the cell region, the top surface of the passivation layer in the cell region having a wave shape, and a plurality of thermal bumps on the passivation layer, the plurality of thermal bumps electrically insulated from the plurality of uppermost wirings.

According to an example embodiment of the inventive concepts, a semiconductor package includes a package substrate and a plurality of semiconductor chips sequentially stacked on the package substrate, each of the plurality of semiconductor chips including a pad region and a cell region, wherein each of the plurality of semiconductor chips includes a semiconductor device layer including a plurality of through silicon via (TSV) structures in the pad region, a plurality of uppermost wirings on the semiconductor device layer, the plurality of uppermost wirings arranged at an equal distance in the cell region, the plurality of uppermost wirings having a same width and extending in parallel along one direction, a plurality of pads on the semiconductor device layer, the plurality of pads connected to the plurality of TSV structures in the pad region, a passivation layer including a bump hole, the bump hole exposing a portion of a top surface of each of the plurality of pads, the passivation layer covering at least a top surface of the plurality of uppermost wirings in the cell region, a plurality of thermal bumps on the passivation layer in the cell region, the plurality of thermal bumps electrically insulated from the plurality of uppermost wirings, and a plurality of signal bumps on the passivation layer in the pad region, the plurality of signal bumps electrically connected to the plurality of pads through the bump hole.

According to an example embodiment of the inventive concepts, a method of manufacturing a semiconductor chip includes preparing a semiconductor device layer including a pad region and a cell region, the semiconductor device layer including a plurality of through silicon via (TSV) structures in the pad region, forming a plurality of uppermost wirings on the semiconductor device layer such that the plurality of uppermost wirings plurality of uppermost wirings are arranged at an equal distance in the cell region, the plurality of uppermost wirings extending in parallel along one direction and having a same width, forming a plurality of pads in the pad region such that the plurality of pads are connected to the plurality of TSV structures in the pad region, forming a passivation layer to cover at least a portion of a top surface of each of the plurality of pads and the plurality of uppermost wirings in the cell region, the passivation layer including a top surface having a step height, forming a mask pattern on the passivation layer such that the mask pattern exposes the at least a portion of the top surface of each of the plurality of pads and a portion of the passivation layer, and forming a pillar layer and a preliminary solder layer on the at least a portion of the top surface of each of the plurality of pads and the portion of the passivation layer exposed by the mask pattern.

According to an example embodiment of the inventive concepts, a semiconductor chip including a pad region and a cell region includes a plurality of through silicon via (TSV) structures in the pad region, a plurality of uppermost wirings in the cell region, the plurality of uppermost wirings forming part of circuit configurations of the semiconductor chip, adjacent ones of the plurality of uppermost wirings being spaced apart by a same distance, each of the plurality of uppermost wirings having a same width, the plurality of uppermost wirings extending in parallel along one direction, a passivation layer in the cell region and the pad region, the passivation layer covering at least a top surface of the plurality of uppermost wirings in the cell region, a top surface of the passivation layer in the cell region having a wave shape, and a plurality of thermal bumps on the passivation layer, the plurality of thermal bumps electrically insulated from the plurality of uppermost wirings, a plurality of pads on the semiconductor device layer in the pad region.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
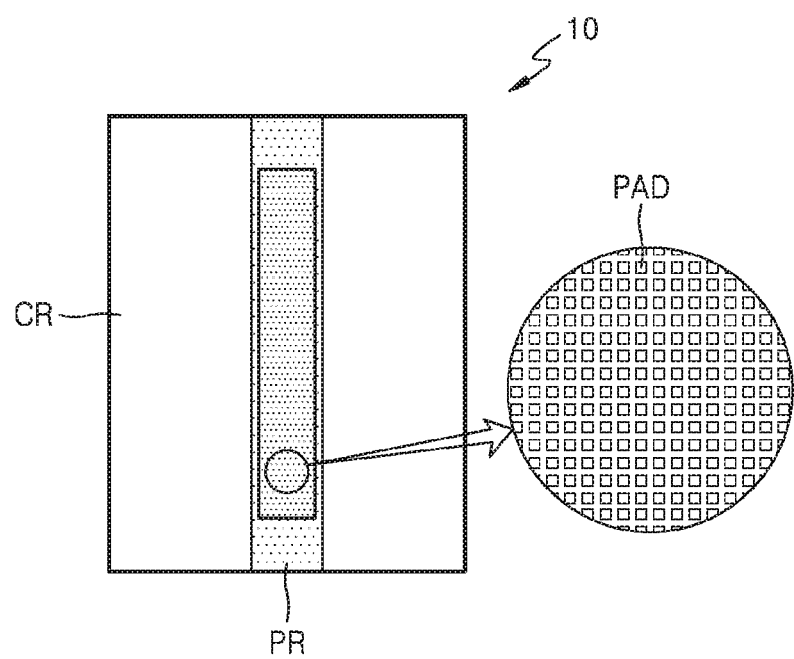
FIG. 1 is a layout schematically illustrating a configuration of a semiconductor chip according to an example embodiment.

FIG. 1 is a layout schematically illustrating a configuration of a semiconductor chip 10 according to an example embodiment.

Referring to FIG. 1, the semiconductor chip 10 may include a pad region PR and a cell region CR. The semiconductor chip 10 may be, for example, a memory semiconductor chip. The memory semiconductor chip may be, for example, a volatile memory semiconductor chip such as a dynamic random access memory (DRAM), a static random access memory (SRAM), or the like or a non-volatile memory semiconductor chip such as a phase-change random access memory (PRAM), a magnetoresistive random access memory (MRAM), a ferroelectric random access memory (FRAM), a resistive random access memory (RRAM), or the like. In some example embodiments, the semiconductor chip 10 may be a high bandwidth memory (HBM) DRAM.

When the semiconductor chip 10 is a memory semiconductor chip, a plurality of memory cells (not shown) may be provided in the cell region CR which is a separate region different from the pad region PR.

A plurality of through electrodes (not shown) electrically connected to a bonding pad PAD may be disposed in the pad region PR. The pad region PR may have a certain width and may extend between opposite both edges of the semiconductor chip 10. For example, a width of the pad region PR may be about hundreds μm. The pad region PR may be disposed along a center axis of the semiconductor chip 10 in a long-axis direction, but is not limited thereto. In some example embodiments, the pad region PR may be disposed along a center axis of the semiconductor chip 10 in a short-axis direction or may be disposed along an edge of the semiconductor chip 10.

A plurality of the bonding pads PAD may be arranged to form a matrix having columns and rows in the pad region PR. For example, hundreds to thousands of the bonding pads PAD may be arranged in the form of a matrix in the pad region PR. In the pad region PR, the plurality of bonding pads PAD may be arranged at a certain pitch of tens μm in a column direction and at a certain pitch of tens man in a row direction to form the matrix. For example, the plurality of bonding pads PAD may be arranged at a pitch of 40 μm to 50 μm in the column direction or the row direction to form the matrix. For example, the plurality of bonding pads PAD may have a tetragonal shape having a side length of 20 μm to 40 μm.

The plurality of bonding pads PAD provided in the pad region PR may form a matrix in one rectangle illustrated in the pad region PR in FIG. 1, but is not limited thereto. For example, the plurality of bonding pads PAD provided in the pad region PR may form a matrix in an even number of tetragons (for example, two tetragons or four or more tetragons), which are spaced apart from each other.

In some example embodiments, arrangement of the pad region PR of the semiconductor chip 10 and/or arrangement of the plurality of bonding pads PAD in the pad region PR may be defined based on, for example, standard such as JEDEC Standard.

Figure 2:
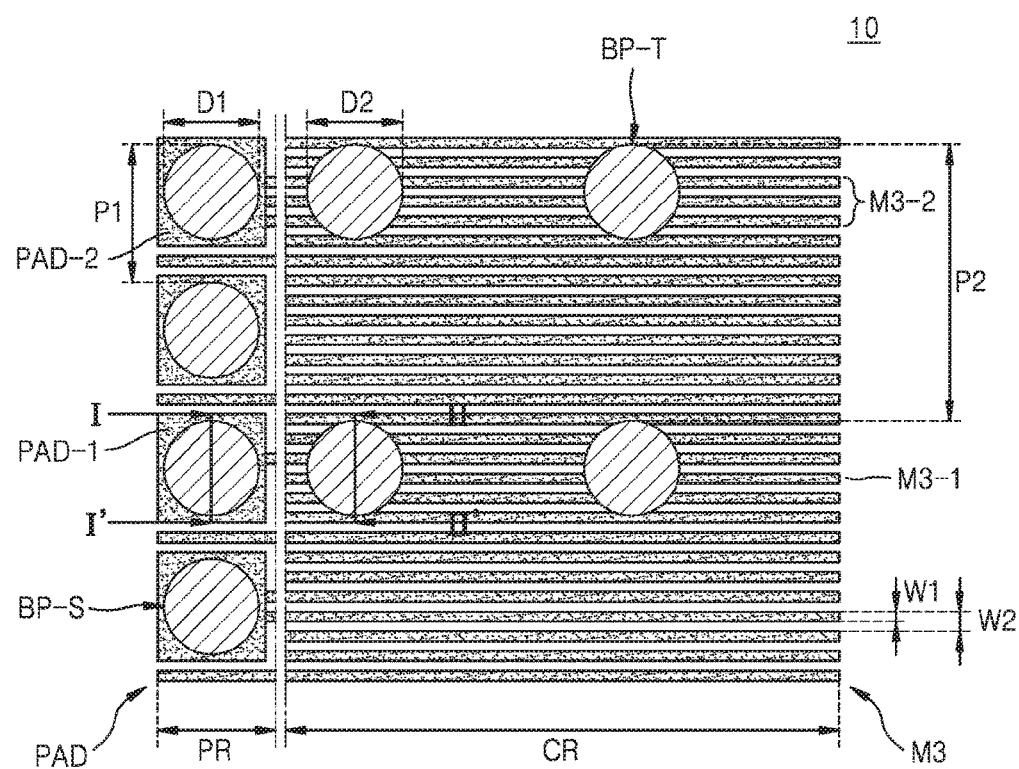
FIG. 2 is a plan view schematically illustrating a configuration of a main part of a semiconductor chip according to an example embodiment.

FIG. 2 is a plan view schematically illustrating a configuration of a main part of a semiconductor chip 10 according to an example embodiment.

Referring to FIG. 2, the semiconductor chip 10 may include a pad region PR and a cell region CR. A plurality of bonding pads PAD and a signal bump BP-S disposed on each of the plurality of bonding pads PAD may be provided in the pad region PR. The signal bump BP-S may be supplied with at least one of a control signal, a power signal, or a ground signal for operating the semiconductor chip 10 from the outside. The signal bump BP-S may be supplied with a data signal, which is to be stored in the semiconductor chip 10, from the outside. The signal bump BP-S may supply data stored in the semiconductor chip 10 to the outside.

An uppermost wiring M3 and a plurality of thermal bumps BP-T disposed on the uppermost wiring M3 may be provided in the cell region CR. The thermal bumps BP-T may dissipate heat, which is generated during operation of the semiconductor chip 10, to the outside. The thermal bumps BP-T may not be electrically connected to a plurality of individual devices which are provided in the semiconductor chip 10 and configure a semiconductor device. In some example embodiments, the thermal bumps BP-T may thermally contact elements provided in the semiconductor chip 10 in order to be used as a heat transfer and dissipation path.

In the present disclosure, an uppermost wiring refers to an uppermost wiring, which forms part of circuit configurations of the semiconductor chip 10 among wirings in a plurality of levels. For example, a redistribution wiring, which is formed on the semiconductor chip 10 for adjusting the arrangement and pitch of the signal bumps BP-S, is not substantially applied to the circuit configuration of the semiconductor chip 10. Thus, the redistribution wiring does not correspond to the uppermost wiring as defined herein.

In the present disclosure, a semiconductor chip including three layers of wirings is described, but is not limited thereto. In other example embodiments, a semiconductor device may include two, or four or more, layers of wirings.

In the present disclosure, a case in which a redistribution wiring is not provided is described, but example embodiments are not limited thereto. For example, when a redistribution wiring is not formed in the semiconductor chip 10, the plurality of bonding pads PAD and the uppermost wiring M3 may be formed together and may be provided on the same layer. For example, when a redistribution wiring is formed in the semiconductor chip 10, the redistribution wiring may be provided on another layer, which is separate from a layer on which the plurality of bonding pads PAD and the uppermost wiring M3 are provided. In such case, the signal bump BP-S may be provided on a connection pad which is connected to the redistribution wiring through the plurality of bonding pads PAD. In some example embodiments, an area of the plurality of bonding pads PAD may not be wider than that of the signal bump BP-S as illustrated in FIG. 2.

The plurality of bonding pads PAD may be electrically connected to a plurality of the signal bumps BP-S, respectively. The plurality of signal bumps BP-S each may have a horizontal width equal to a first distance D1. The plurality of signal bumps BP-S may be arranged at a first pitch P1. The plurality of bonding pads PAD, which correspond to the plurality of signal bumps BP-S respectively, each may have a tetragonal shape which has a side length having a value greater than the first distance D1. For example, when the first distance D1 is 25 µm, a side length of each of the plurality of bonding pads PAD may be 30 µm.

The uppermost wiring M3 may be electrically insulated from the plurality of thermal bumps BP-T. For example, a passivation layer (150 of FIG. 3) may be disposed between the uppermost wiring M3 and the plurality of thermal bumps BP-T to electrically insulate the uppermost wiring M3 from the plurality of thermal bumps BP-T.

A plurality of the uppermost wirings M3 may extend in parallel along one direction (e.g., a horizontal direction of FIG. 2). The plurality of uppermost wirings M3 may have the same width, namely, a first width W1, and may be arranged at an equal distance. The plurality of uppermost wirings M3 may be arranged at a pitch equal to a second width W2.

The plurality of thermal bumps BP-T each may have a horizontal width equal to a second distance D2. The plurality of thermal bumps BP-T may be arranged at a second pitch P2. The second distance D2 may have a value equal to or greater than that of the first distance D1. The second pitch P2 may have a value equal to or greater than that of the first pitch P1. In some example embodiments, the second distance D2 and the first distance D1 may have the same value, and the second pitch P2 may have a value which is approximately two times value of the first pitch P1.

The plurality of uppermost wirings M3 each may have the first width W1 and the plurality of uppermost wirings M3 may have a pitch equal to the second width W2 in the cell region CR and may be arranged in parallel along the one direction (e.g., the horizontal direction of FIG. 2). In some example embodiments, the plurality of uppermost wirings M3 each may have the first width W1, the plurality of uppermost wirings M3 may have a pitch equal to the second width W2, the plurality of uppermost wirings M3 may be provided under the plurality of thermal bumps BP-T and/or at positions adjacent to the plurality of thermal bumps BP-T, and the plurality of thermal bumps BP-T may extend in parallel along the one direction (e.g., the horizontal direction of FIG. 2). The plurality of uppermost wirings M3 may have different widths, different pitches, and/or different extension directions at positions, at which the plurality of thermal bumps BP-T are not provided, in the cell region CR.

Some of the plurality of uppermost wirings M3 may extend from the cell region CR to the pad region PR and may be spaced apart from and extend between adjacent bonding pads PAD.

Some of the plurality of uppermost wirings M3 may extend from the cell region CR to the pad region PR. Some of the plurality of uppermost wirings M3 may extend from the cell region CR to the pad region PR and may be connected to a corresponding bonding pad PAD. Wirings connected to a corresponding bonding pad PAD among the plurality of uppermost wirings M3 may be referred to as connection wirings M3-1 and M3-2.

Some of the plurality of bonding pads PAD may be connected to one uppermost wiring M3 or a plurality of uppermost wiring M3. A second pad PAD-2 of the plurality of bonding pads PAD may be connected to more uppermost wirings M3 than the number of uppermost wirings M3 connected to a first pad PAD-1. For example, the first pad PAD-1 may be connected to one first connection wiring M3-1, and the second pad PAD-2 may be connected to a second connection wiring M3-2. The second connection wiring M3-2 may include two or more uppermost wirings M3. That is, two or more adjacent uppermost wirings M3 (i.e., second connection wirings M3-2) connected to the second pad PAD-2 may be electrically connected to each other to function as one wiring. At least some of the second connection wirings M3-2 which are electrically connected to each other to function as one wiring may extend under the thermal bump BP-T.

Some of the plurality of bonding pads PAD may not be connected to the uppermost wirings M3.

Figure 3:
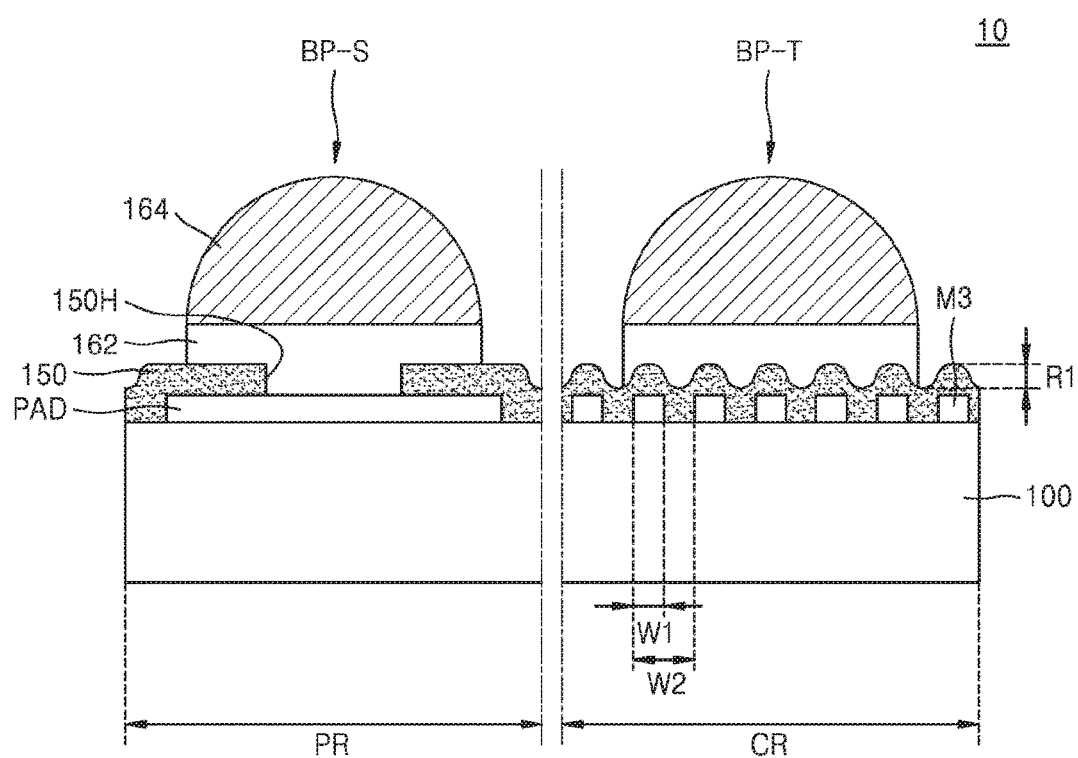
FIG. 3 is a cross-sectional view schematically illustrating a configuration of a main part of a semiconductor chip according to an example embodiment.

FIG. 3 is a cross-sectional view schematically illustrating a configuration of a main part of the semiconductor chip 10 according to an example embodiment.

Referring to FIG. 3, the semiconductor chip 10 may include a pad region PR and a cell region CR. The semiconductor chip 10 may include a semiconductor device layer 100 and a plurality of uppermost wirings M3 disposed on the semiconductor device layer 100. The pad region PR of the semiconductor chip 10 may further include a bonding pad PAD disposed on the semiconductor device layer 100.

In the present disclosure, the semiconductor device layer 100 may include a plurality of individual devices which are provided under the plurality of uppermost wirings M3 in the semiconductor chip 10 and configure a semiconductor device on a semiconductor substrate, a plurality of elements which electrically connect the plurality of individual devices, and an interlayer insulation layer and an inter-wiring insulation layer which are disposed therebetween. The semiconductor device layer 100 may further include a TSV structure electrically connected to the bonding pad PAD. Elements of the semiconductor device layer 100 will be described with reference to FIGS. 7 to 9.

The semiconductor chip 10 may be, for example, a memory semiconductor chip. In some example embodiments, the semiconductor chip 10 may be an HBM DRAM having the TSV structure.

The bonding pad PAD and the plurality of uppermost wirings M3 may be formed together and may by provided on the same layer. In some example embodiments, the bonding pad PAD and the plurality of uppermost wirings M3 may be formed to have a thickness of hundreds nm to several μm.

The plurality of the uppermost wirings M3 may have the same width, namely, a first width W1, and may be arranged at an equal distance. The first width W1 may be hundreds nm. In some example embodiments, the first width W1 may be 200 nm to 500 nm. The plurality of the uppermost wirings M3 may be arranged at a pitch equal to a second width W2. The second width W2 may have a value greater than the first width W1, and in some example embodiments, the second width W2 may be equal to or less than 1 μm.

A passivation layer 150 may be formed on the bonding pad PAD and the plurality of uppermost wiring M3. The passivation layer 150 may include a bump hole 150H that exposes at least a portion of a top of the bonding pad PAD. The passivation layer 150 may be formed of, for example, an inorganic insulating material. In some example embodiments, the passivation layer 150 may be formed of silicon oxide.

The passivation layer 150 may have a thickness of hundreds nm to several an. A shape of each of the plurality of uppermost wirings M3 may be partially transferred to a top of the passivation layer 150, and the top of the passivation layer 150 may have a first step height R1. In some example embodiments, the top of the passivation layer 150 may have a concave-convex shape which is consistently repeated like a wave shaped surface, and the first step height R1 may be a height between a top and a bottom of a wave shape of the top of the passivation layer 150.

The first step height R1 may have a value less than a thickness of each of the plurality of the uppermost wirings M3. The first step height R1 may have a value equal to or less than 100 nm.

A signal bump BP-S may be provided on the bonding pad PAD in the pad region PR. The signal bump BP-S may be supplied with at least one of a control signal, a power signal, or a ground signal for operating the semiconductor chip 10 from the outside. The signal bump BP-S may be supplied with a data signal, which is to be stored in the semiconductor chip 10, from the outside. The signal bump BP-S may supply data stored in the semiconductor chip 10 to the outside. The signal bump BP-S may be electrically connected to the bonding pad PAD through a bump hole 150H. A diameter of the bump hole 150H may have a value less than a width of the signal bump BP-S and a width of the bonding pad PAD. Therefore, a portion of a bottom of the signal bump BP-S may contact the bonding pad PAD, and other a portion of the bottom may contact the passivation layer 150.

A thermal bumps BP-T which is disposed on the uppermost wirings M3 with the passivation layer 150 thereon and therebetween may be provided in the cell region CR. The thermal bump BP-T may dissipate heat, generated during operation of the semiconductor chip 10, to the outside. The thermal bump BP-T may be electrically insulated from the uppermost wiring M3 by the passivation layer 150. The thermal bump BP-T may not be connected to a plurality of individual devices, which are provided on the semiconductor device layer 100 of the semiconductor chip 10 and configure a semiconductor device. In some example embodiments, the thermal bump BP-T may thermally contact an element provided in the semiconductor device layer 100 in order to be used as a heat transfer and dissipation path.

The signal bump BP-S and the thermal bump BP-T may each include a pillar layer 162 and a solder layer 164 disposed on the pillar layer 162. The pillar layer 162 may be formed of, for example, copper (Cu), nickel (Ni), gold (Au), and/or the like. The pillar layer 162, for example, may be formed of one metal selected from among Cu, Ni, and Au or an alloy thereof or may have a multilayer structure including a plurality of metals selected from among Cu, Ni, and Au. The pillar layer 162 may be formed through an electroplating process.

The solder layer 164 may include an alloy of tin (Sn) and silver (Ag), and depending on the case, copper (Cu), palladium (Pd), bismuth (Bi), antimony (Sb), and/or the like may be added into the solder layer 164. A preliminary solder layer may be formed, and then, the solder layer 164 may be formed to have a convex shape through thermal treatment. The preliminary solder layer may be formed through an electroplating process. In some example embodiments, the pillar layer 162 and the preliminary solder layer each may be formed through a separate electroplating process.

The signal bump BP-S and the thermal bump BP-T may be formed together, and an upper end of the signal bump BP-S and an upper end of the thermal bump BP-T may have the same level.

A bottom of the thermal bump BP-T, namely, a bottom of a pillar layer configuring the thermal bump BP-T, may contact the top of the passivation layer 150. Therefore, the bottom of the thermal bump BP-T may have a concave-convex shape such as a wave shaped surface corresponding to the top of the passivation layer 150.

In a photolithography process of forming the signal bump BP-S and the thermal bump BP-T, reflection may occur in photo exposure due to a step height caused by the uppermost wirings M3 and/or a shape of the top of the passivation layer in the cell region CR. Here, when at least some of the plurality of uppermost wirings M3 have different widths or are arranged at different intervals, diffuse reflection occurs in the top of the passivation layer 150, and for this reason, a shape of the thermal bump BP-T is abnormally formed. When the shape of the thermal bump BP-T is abnormally formed due to the diffuse reflection, a height difference occurs between the signal bump BP-S and the thermal bump BP-T. When the height difference occurs between the signal bump BP-S and the thermal bump BP-T, a contact defect occurs in at least a portion of the signal bump BP-S and the thermal bump BP-T. Thus, the semiconductor chip 10 cannot normally operate, or heat generated from the semiconductor chip 10 may not be normally dissipated.

For example, when a protection layer including an organic insulating material such as photosensitive polyimide (PSPI) or the like for counteracting a step height of the top of the passivation layer 150 is further formed on the passivation layer 150 in order to prevent diffuse reflection from occurring in photo exposure, a thickness of the semiconductor chip 10 increases, and a warpage may occur in the semiconductor chip 10 due to a thermal expansion coefficient difference between the protection layer and the semiconductor device layer 100. Even in this case, a contact defect may occur in at least some of the signal bumps BP-S and the thermal bumps BP-T, and thus, the semiconductor chip 10 may not normally operate, or heat generated from the semiconductor chip 10 may not be normally dissipated.

However, in the semiconductor chip 10 according to an example embodiment, the plurality of uppermost wirings M3 may have the same width and may be arranged at an equal distance in the cell region CR, and thus, the top of the passivation layer 150 may have a surface shape of a wave which is consistently repeated, thereby mitigated or preventing diffuse reflection from occurring in photo exposure. Therefore, a shape of the thermal bump BP-T is normally formed, and a warpage may be mitigated or prevented from occurring in the semiconductor chip 10. Accordingly, an upper end of the signal bump BP-S and an upper end of the thermal bump BP-T may have the same level. Thus, a contact defect may be mitigated or prevented from occurring in the signal bump BP-S and the thermal bump BP-T, thereby securing reliability of the semiconductor chip 10 and/or efficiently dissipating heat generated from the semiconductor chip 10.

Figure 4:
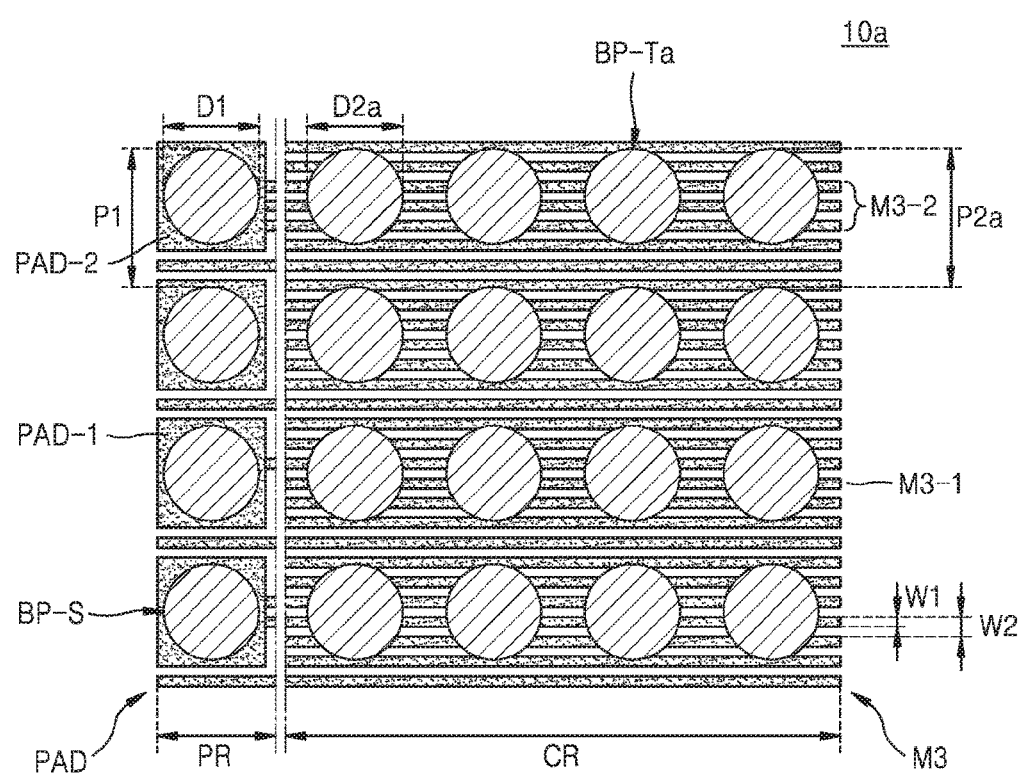
FIG. 4 is a plan view schematically illustrating a configuration of a main part of a semiconductor chip according to an example embodiment.

FIG. 4 is a plan view schematically illustrating a configuration of a main part of a semiconductor chip 10a according to an example embodiment. In providing description with reference to FIG. 4, details which are similar to or the same as the details described above with reference to FIGS. 1 to 3 may be omitted, and like reference numerals refer to like elements.

Referring to FIG. 4, the semiconductor chip 10a may include a pad region PR and a cell region CR. A plurality of bonding pads PAD and a signal bump BP-S disposed on the plurality of bonding pads PAD may be provided in the pad region PR. An uppermost wiring M3 and a plurality of thermal bumps BP-Ta disposed on the uppermost wiring M3 may be provided in the cell region CR.

The plurality of bonding pads PAD may be electrically connected to a plurality of the signal bumps BP-S, respectively. The plurality of signal bumps BP-S each may have a horizontal width equal to a first distance D1. The plurality of signal bumps BP-S may be arranged at a first pitch P1. The plurality of bonding pads PAD, which correspond to the plurality of signal bumps BP-S respectively, each may have a tetragonal shape which has a side length having a value greater than the first distance D1.

The uppermost wiring M3 may be electrically insulated from the plurality of thermal bumps BP-Ta. For example, a passivation layer (150 of FIG. 3) may be disposed between the uppermost wiring M3 and the plurality of thermal bumps BP-Ta to electrically insulate the uppermost wiring M3 from the plurality of thermal bumps BP-Ta.

A plurality of the uppermost wirings M3 may extend in parallel along one direction (e.g., a horizontal direction of FIG. 4). The plurality of uppermost wirings M3 may have the same width, namely, a first width W1, and may be arranged at an equal distance. The plurality of uppermost wirings M3 may be arranged at a pitch equal to a second width W2.

The plurality of thermal bumps BP-Ta each may have a width equal to a second distance D2a. The plurality of thermal bumps BP-Ta may be arranged at a second pitch P2a. The second distance D2a may have a value equal to or greater than that of the first distance D1. The second pitch P2a may have a value equal to or greater than that of the first pitch P1. In some example embodiments, the second distance D2a and the first distance D1 may have the same value, and the second pitch P2 may have a value which is the same as that of the first pitch P1.

The plurality of uppermost wirings M3 each may have the same first width W1, and the plurality of uppermost wirings M3 may have a pitch equal to the second width W2 in the cell region CR and may be arranged in parallel along the one direction (the horizontal direction of FIG. 4). In some example embodiments, the plurality of uppermost wirings M3 each may have the first width W1, the plurality of uppermost wirings M3 may have a pitch equal to the second width W2, the plurality of uppermost wirings M3 may be provided under the plurality of thermal bumps BP-Ta and/or at positions adjacent to the plurality of thermal bumps BP-T, and the plurality of thermal bumps BP-T may extend in parallel along the one direction (the horizontal direction of FIG. 4). The plurality of uppermost wirings M3 may have different widths, different pitches, and/or different extension directions at positions, at which the plurality of thermal bumps BP-Ta are not provided, in the cell region CR.

Some of the plurality of uppermost wirings M3 may extend from the cell region CR to the pad region PR and may be spaced apart from and extend between adjacent bonding pads PAD.

Some of the plurality of uppermost wirings M3 may extend from the cell region CR to the pad region PR. Some of the plurality of uppermost wirings M3 may extend from the cell region CR to the pad region PR and may be connected to a corresponding bonding pad PAD. Wirings connected to a corresponding bonding pad PAD among the plurality of uppermost wirings M3 may be referred to as connection wirings M3-1 and M3-2.

Some of the plurality of bonding pads PAD may be connected to one uppermost wiring M3 or a plurality of uppermost wiring M3. A first pad PAD-1 of the plurality of bonding pads PAD may be connected to more uppermost wirings M3 than the number of uppermost wirings M3 connected to a second pad PAD-2. Two or more adjacent uppermost wirings M3 (e.g., second connection wirings M3-2) connected to the second pad PAD-2 may be electrically connected to each other to function as one wiring. At least some of the second connection wirings M3-2 which are electrically connected to each other to function as one wiring may extend under the thermal bump BP-T.

Some of the plurality of bonding pads PAD may not be connected to the uppermost wirings M3.

Figure 5:
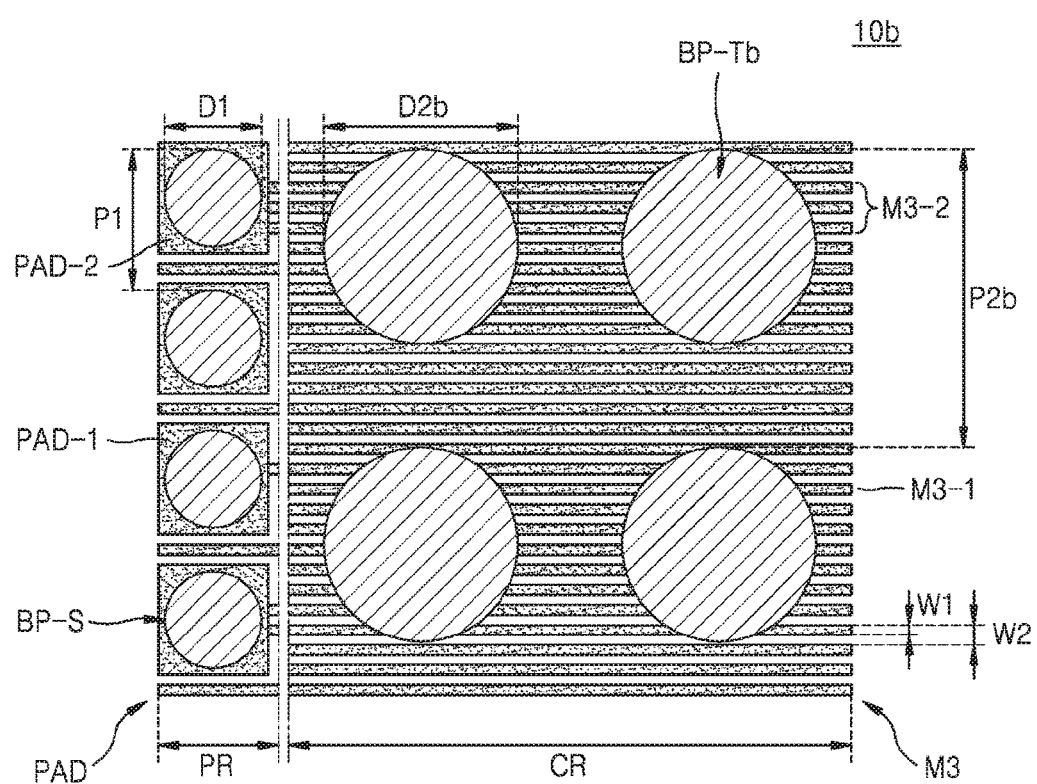
FIG. 5 is a plan view schematically illustrating a configuration of a main part of a semiconductor chip according to an example embodiment.

FIG. 5 is a plan view schematically illustrating a configuration of a main part of a semiconductor chip 10b according to an example embodiment. In providing description with reference to FIG. 5, details which are similar to or the same as the details described above with reference to FIGS. 1 to 4 may be omitted, and like reference numerals refer to like elements.

Referring to FIG. 5, the semiconductor chip 10b may include a pad region PR and a cell region CR. A plurality of bonding pads PAD and a signal bump BP-S disposed on each of the plurality of bonding pads PAD may be provided in the pad region PR. Uppermost wirings M3 and a plurality of thermal bumps BP-Tb disposed on the uppermost wirings M3 may be provided in the cell region CR.

The plurality of bonding pads PAD may be electrically connected to a plurality of the signal bumps BP-S, respectively. The plurality of signal bumps BP-S each may have a horizontal width equal to a first distance D1. The plurality of signal bumps BP-S may be arranged at a first pitch P1. The plurality of bonding pads PAD, which correspond to the plurality of signal bumps BP-S respectively, each may have a tetragonal shape which has a side length having a value greater than the first distance D1.

The uppermost wiring M3 may be electrically insulated from the plurality of thermal bumps BP-Tb. For example, a passivation layer (150 of FIG. 3) may be disposed between the uppermost wiring M3 and the plurality of thermal bumps BP-Ta to electrically insulate the uppermost wiring M3 from the plurality of thermal bumps BP-Tb.

A plurality of the uppermost wirings M3 may extend in parallel along one direction (a horizontal direction of FIG. 5). The plurality of uppermost wirings M3 may have the same width, namely, a first width W1, and may be arranged at an equal distance. The plurality of uppermost wirings M3 may be arranged at a pitch equal to a second width W2.

The plurality of thermal bumps BP-Tb may each have a width equal to a second distance D2b. The plurality of thermal bumps BP-Tb may be arranged at a second pitch P2b. The second distance D2b may have a value equal to or greater than that of the first distance D1. The second pitch P2b may have a value equal to or greater than that of the first pitch P1. In some example embodiments, the second distance D2b may have a value which is approximately two times value of the first distance D1, and the second pitch P2 may have a value which is approximately two times value of the first pitch P1.

The plurality of uppermost wirings M3 each may have a first width W1, and the plurality of uppermost wirings M3 may have a pitch equal to the second width W2 in the cell region CR and may be arranged in parallel along the one direction (the horizontal direction of FIG. 5). In some example embodiments, the plurality of uppermost wirings M3 each may have the first width W1, the plurality of uppermost wirings M3 may have a pitch equal to the second width W2, the plurality of uppermost wirings M3 may be provided under the plurality of thermal bumps BP-Tb and/or positions adjacent to the plurality of thermal bumps BP-Tb, and the plurality of thermal bumps BP-Tb may extend in parallel along the one direction (the horizontal direction of FIG. 5). The plurality of uppermost wirings M3 may have different widths, different pitches, and/or different extension directions at positions, at which the plurality of thermal bumps BP-Tb are not provided, in the cell region CR.

Some of the plurality of uppermost wirings M3 may extend from the cell region CR to the pad region PR and may be spaced apart from and extend between adjacent bonding pads PAD.

Some of the plurality of uppermost wirings M3 may extend from the cell region CR to the pad region PR. Some of the plurality of uppermost wirings M3 may extend from the cell region CR to the pad region PR and may be connected to a corresponding bonding pad PAD. Wirings connected to a corresponding bonding pad PAD among the plurality of uppermost wirings M3 may be referred to as connection wirings M3-1 and M3-2.

Some of the plurality of bonding pads PAD may be connected to one uppermost wiring M3 or a plurality of uppermost wiring M3. A first pad PAD-1 of the plurality of bonding pads PAD may be connected to more uppermost wirings M3 than the number of uppermost wirings M3 connected to a second pad PAD-2. Two or more adjacent uppermost wirings M3 (e.g., second connection wirings M3-2) connected to the second pad PAD-2 may be electrically connected to each other to function as one wiring. At least some of the second connection wirings M3-2 which are electrically connected to each other to function as one wiring may extend under the thermal bump BP-T.

Some of the plurality of bonding pads PAD may not be connected to the uppermost wirings M3.

Figure 6:
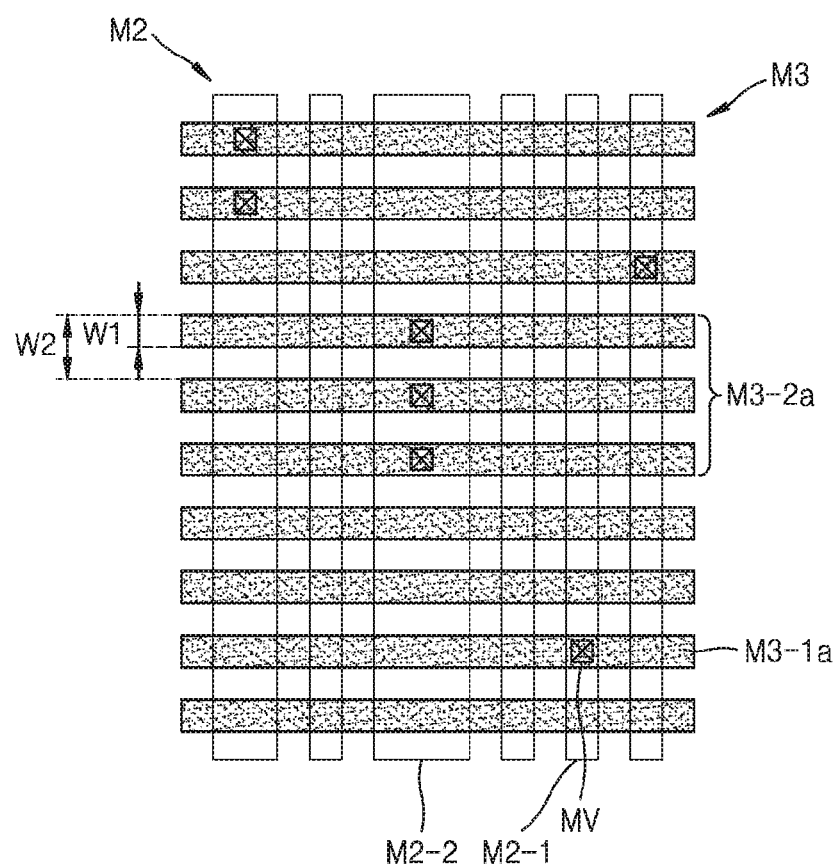
FIG. 6 is a conceptual view for describing a connection relationship of two set of wirings included in a semiconductor chip according to an example embodiment.

FIG. 6 is a conceptual view for describing a connection relationship of two set of wirings included in a semiconductor chip according to an example embodiment.

Referring to FIG. 6, a plurality of uppermost wirings M3 may extend in parallel along one direction (a horizontal direction of FIG. 6). The plurality of uppermost wirings M3 may have the same width, namely, a first width W1, and may be arranged at an equal distance. The plurality of uppermost wirings M3 may be arranged at a pitch equal to a second width W2.

A plurality of lower wirings M2 may extend in parallel along one direction (a perpendicular direction of FIG. 6) under the plurality of uppermost wirings M3. At least some of the plurality of lower wirings M2 may have different widths.

Some of the plurality of uppermost wirings M3 each may be electrically connected to a corresponding one of the lower wiring M2 through a wiring via MV, which is provided between a corresponding one of the uppermost wiring M3 and a corresponding one of the lower wiring M2. Wirings from among the plurality of uppermost wirings M3 that are connected to corresponding ones of the lower wiring M2 may be referred to as connection wirings M3-1a and M3-2a.

Some of the plurality of lower wirings M2 may be connected to corresponding one or more of the uppermost wirings M3. A second lower wiring M2-2 of the plurality of lower wirings M2 may be connected to a number of the uppermost wirings M3 greater than the number of uppermost wirings M3 connected to a first lower wiring M2-1. For example, the first lower wiring M2-1 may be connected to one first connection wiring M3-1a, and the second lower wiring M2-2 may be connected to a second connection wiring M3-2a. The second connection wiring M3-2a may be configured with two or more uppermost wirings M3. That is, two or more adjacent ones of the uppermost wirings M3 (e.g., second connection wirings M3-2a) connected to the second lower wiring M2-2 may be electrically connected to each other to function as one wiring. At least some of the second connection wirings M3-2a which are electrically connected to each other to function as one wiring may extend under the thermal bump (BP-T, BP-Ta and BP-Tb of FIGS. 3 to 5).

Some of the plurality of lower wirings M2 may not be connected to the uppermost wirings M3.

Referring to FIGS. 2, 4, 5 and 6, some of the plurality of uppermost wirings M3 may be electrically connected to one bonding pad PAD or two or more bonding pads PAD or may be electrically connected to one of the lower end wirings M2 or two or more of the lower end wirings M2. In some example embodiments, some of the plurality of uppermost wirings M3 may be electrically connected to one, two, or more of the bonding pads PAD, or the other some of the plurality of uppermost wirings M3 may be electrically connected to one of the lower wirings M2 or two or more of the lower wirings M2.

Some of the plurality of uppermost wirings M3 may be dummy wirings which are not electrically connected to the bonding pad PAD and the lower wiring M2.

In some example embodiments, the plurality of lower wirings M2 may have the same width, may be arranged at an equal distance, and may extend in a state of having the same pitch, and similarly to the plurality of uppermost wirings M3, two or more of the plurality of lower wirings M2 may be electrically connected to each other another to function as one wiring.

Referring to FIGS. 2 and 6, the plurality of the uppermost wirings M3 may extend in parallel along one direction (the horizontal direction of FIGS. 2 to 6). The plurality of uppermost wirings M3 may have the same width, namely, a first width W1, and may be arranged at an equal distance. The plurality of uppermost wirings M3 may be arranged at a pitch equal to a second width W2.

In some example embodiments, some adjacent ones of the uppermost wirings M3 may be electrically connected to one bonding pad PAD and/or one lower wiring M2 to function as one wiring. The some adjacent ones of the uppermost wirings M3, which are electrically connected to each other to function as one wiring, may extend under the thermal bump BP-T, BP-Ta or BP-Tb. In some example embodiments, the number of uppermost wirings M3 electrically connected to one bonding pad PAD and/or one lower wiring M2 may be changed. The number of uppermost wirings M3 electrically connected to one bonding pad PAD and/or one lower wiring M2 may be two, three or more. Some of the plurality of uppermost wirings M3 may be dummy wirings which are electrically insulated from one bonding pad PAD and/or one lower wiring M2.

For example, in a first set of uppermost wirings M3, which is used for transferring a power signal and/or a ground signal, among the plurality of uppermost wirings M3, the first set may include uppermost wirings M3 in a relatively large number, and the uppermost wirings M3 included in the first set may be electrically connected to one bonding pad PAD and/or one lower wiring M2 to function as one wiring. For example, in a second set of uppermost wirings M3, which is used for transferring a control signal and/or a data signal, among the plurality of uppermost wirings M3, the second set may include uppermost wirings M3 in a relatively small number, and the uppermost wiring M3 included in the second set may be electrically connected to one bonding pad PAD and/or one lower wiring M2 to function as one wiring.

That is, in the semiconductor chip 10, 10a or 10b according to an example embodiment, the plurality of uppermost wirings M3 each have the same width W1, and the plurality of uppermost wirings are arranged to have a pitch of the second widths W2. Further, electrical characteristics desired for various kinds of signals may be provided by variously changing the number of uppermost wirings M3 electrically connected to one bonding pad PAD and/or one lower wiring M2.

Figure 7:
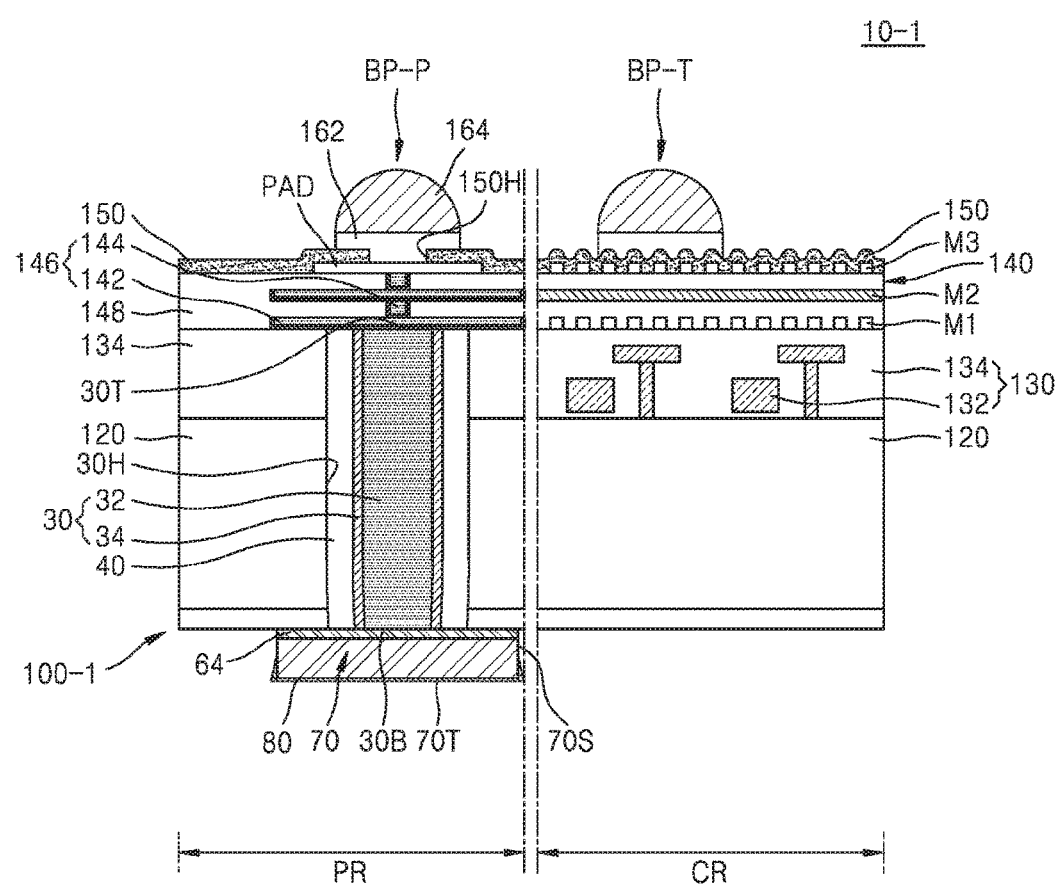
FIG. 7 is a cross-sectional view schematically illustrating a configuration of a semiconductor chip according to an example embodiment.

FIG. 7 is a cross-sectional view schematically illustrating a configuration of a semiconductor chip 10-1 according to an example embodiment.

Referring to FIG. 7, the semiconductor chip 10-1 may include a pad region PR and a device region (or alternatively, cell region) CR. The semiconductor chip 10-1 may include a semiconductor substrate 120, a front-end-of-line (FEOL) structure 130, and a back-end-of-line (BEOL) structure 140.

A TSV structure 30 disposed in the pad region PR of the semiconductor chip 10-1 may be provided in a via hole 22 passing through the FEOL 130 and the semiconductor substrate 120. A via insulation layer 40 may be disposed between the semiconductor substrate 120 and the TSV structure 30 and between the FEOL structure 130 and the TSV structure 30.

The TSV structure 30 may include a conductive plug 32, which passes through the semiconductor substrate 120 and the FEOL structure 130, and a conductive barrier layer 34 surrounding the conductive plug 32. The conductive plug 32 may include, for example, Cu or tungsten (W). For example, the conductive plug 32 may include Cu, CuSn, CuMg, CuNi, CuZn, CuPd, CuAu, CuRe, CuW, W, or a W alloy, but is not limited thereto. For example, the conductive plug 32 may include one or more of aluminum (Al), gold (Au), beryllium (Be), bismuth (Bi), cobalt (Co), Cu, hafnium (Hf), indium (In), manganese (Mn), molybdenum (Mo), Ni, plumbum (Pb), palladium (Pd), platinum (Pt), rhodium (Rh), rhenium (Re), ruthenium (Ru), tantalum (Ta), tellurium (Te), titanium (Ti), W, zinc (Zn), and zirconium (Zr), and may include a stacked structures of one or more layers. The conductive barrier layer 34 may include at least one material selected from among W, WN, WC, Ti, TiN, Ta, TaN, Ru, Co, Mn, WN, Ni, and NiB and may be formed of a single layer or a multilayer. However, a material of the TSV structure 30 is not limited thereto. The conductive plug 32 and the conductive barrier layer 34 may be formed by a physical vapor deposition (PVD) process or a chemical vapor deposition (CVD) process, but is not limited thereto.

The via insulation layer 40 may include oxide, nitride, carbide, a polymer, or a combination thereof. In some example embodiments, the CVD process may be used for forming the via insulation layer 40. The via insulation layer 40 may be formed of high aspect ratio process (HARP) oxide based on ozone/tetra-ethyl ortho-silicate (O3/TEOS) formed by a sub-atmospheric CVD process.

The semiconductor substrate 120 may be a semiconductor wafer. The semiconductor substrate 120 may include, for example, silicon (Si). The semiconductor substrate 120 may include, for example, a semiconductor element such as germanium (Ge) and/or the like, or a compound semiconductor such as silicon carbide (SiC), gallium arsenide (GaAs), indium arsenide (InAs), indium phosphide (InP), and/or the like. The semiconductor substrate 120 may have, for example, a silicon-on insulator (SOI) structure. The semiconductor substrate 120 may include, for example, a buried oxide layer (BOX). The semiconductor substrate 120 may include a conductive region, for example, a well doped with impurities, or an impurity-doped structure. Also, the semiconductor substrate 120 may have various isolation structures such as a shallow trench isolation (STI) structure.

The FEOL structure 130 may include a plurality of various kinds of individual devices 132 and an interlayer insulation layer 134. The individual devices 132 may be disposed in the device region CR.

The plurality of individual devices 132 may include various microelectronic devices, for example, image sensors such as a metal-oxide-semiconductor field effect (MOSFET), system large scale integration (LSI), and a CMOS imaging sensor (CIS), a micro-electro-mechanical system (MEMS), an active device, and a passive device. The plurality of individual devices 132 may be electrically connected to the conductive region of the semiconductor substrate 120. Also, each of the plurality of individual devices 132 may be electrically isolated from other individual devices adjacent thereto by the interlayer insulation layer 134 and may be electrically connected to the other individual devices by a conductive line and a contact plug. In some example embodiments, the plurality of individual devices 132 may configure a dynamic random access memory (DRAM) cell.

The BEOL structure 140 may include a multilayer wiring structure 146 that includes a plurality of metal wiring layers 142 and a plurality of via plugs 144. A portion of the multilayer wiring structure 146 may be connected to the TSV structure 30. The plurality of metal wiring layers 142 may include a first wiring M1, a second wiring M2, and a third wiring M3. When the plurality of metal wiring layers 142 include three wiring layers respectively including the first to third wirings M1 to M3, the third wiring M3 configuring an uppermost wiring layer may be referred to as an uppermost wiring M3, and a second wiring M2 configuring a wiring layer just under the uppermost wiring M3 may be referred to as a lower wiring M2.

The wiring via MV illustrated in FIG. 6 may correspond to the via plug 144 that connects the second wiring M2 to the third wiring M3.

A portion of the multilayer wiring structure 146 may be connected to the plurality of individual devices 132 to configure a semiconductor device. The multilayer wiring structure 146, which connects the plurality of individual devices 132 included in the FEOL structure 130 and includes the first to third wirings M1 to M3, may be provided in the device region CR of the BEOL structure 140. A plurality of the third wirings M3 may extend in parallel along one direction. The plurality of third wirings M3 may have the same width and may be arranged at an equal distance. The plurality of third wirings M3 may be arranged at the same pitch.

A plurality of the multilayer wiring structures 146 included in the BEOL structure 140 may be insulated from each other by an inter-wiring insulation layer 148. The BEOL structure 140 may further include a seal ring (not shown) for protecting the multilayer wiring structures 146 and other structures thereunder from an external shock or moisture.

Figure 8:
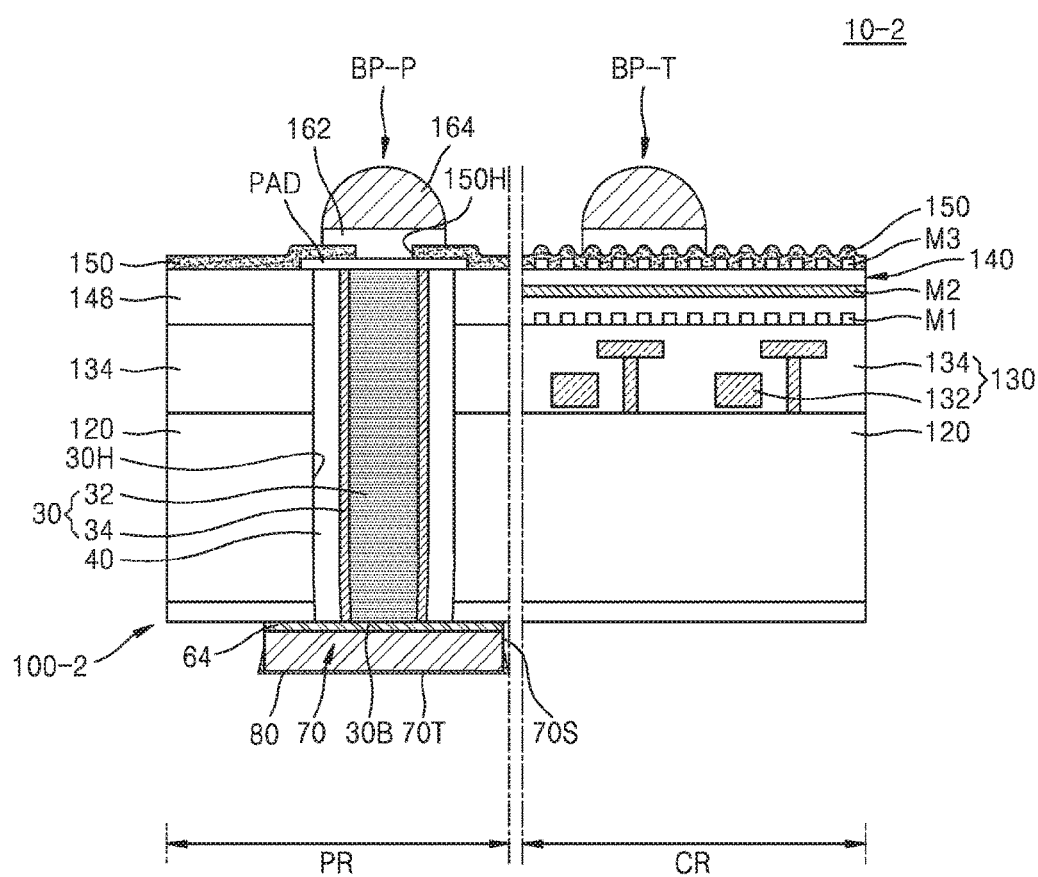
FIG. 8 is a cross-sectional view schematically illustrating a configuration of a semiconductor chip according to an example embodiment.
Figure 9:
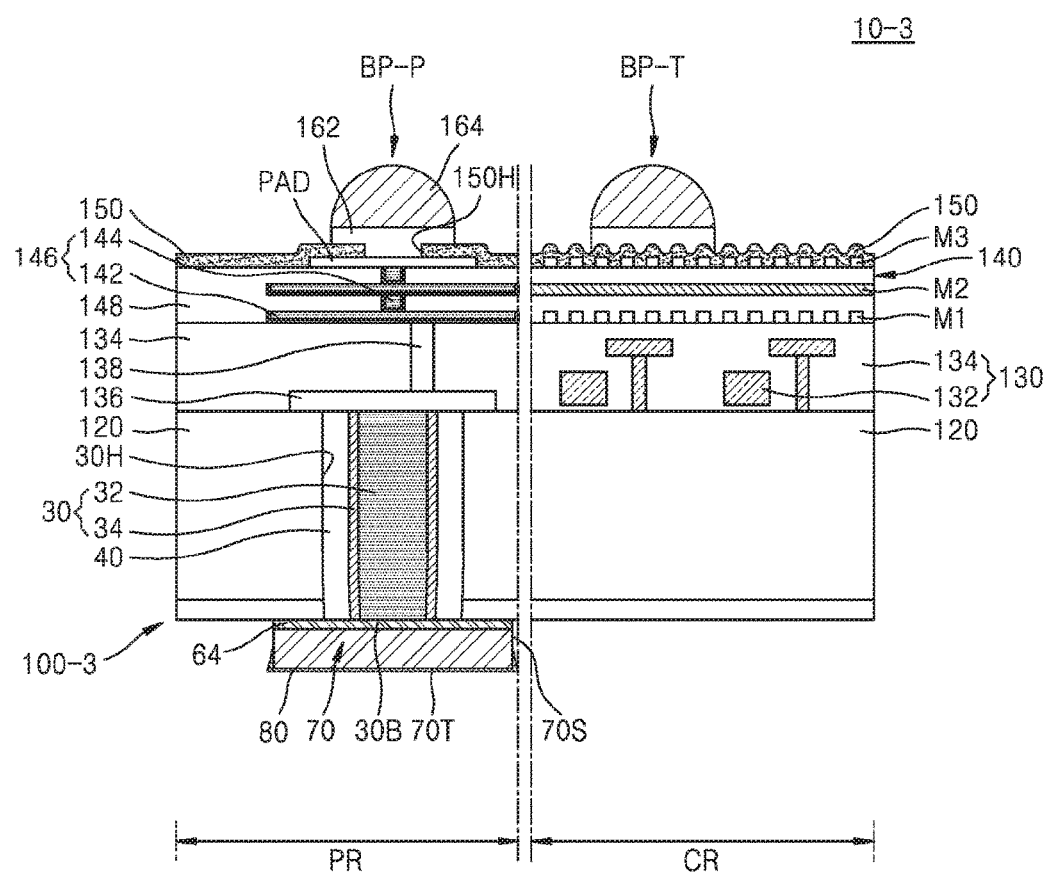
FIG. 9 is a cross-sectional view schematically illustrating a configuration of a semiconductor chip according to an example embodiment.

In the present disclosure, elements under a top of the inter-wiring insulation layer 148 may each be referred to as a semiconductor device layer (100-1, 100-2 of FIG. 8, and 100-3 of FIG. 9). A bonding pad PAD and the third wiring M3 may be provided on the semiconductor device layer 100-1. In some example embodiments, the bonding pad PAD may be a portion of the third wiring M3.

A top 30T of the TSV structure 30 that is exposed by the semiconductor substrate 120 and the FEOL structure 130 may be connected to the metal wiring layer 142 of the multilayer wiring structure 146 included in the BEOL structure 140. In some example embodiments, the top 30T of the TSV structure 30 may be connected to the first wiring M1.

At least a portion of the bonding pad PAD and a passivation layer 150 which covers the third wiring M3 may be provided on the inter-wiring insulation layer 148. The passivation layer 150 may be formed of an inorganic insulating material. In some example embodiments, the passivation layer 150 may be formed of nitride. A hole 150H that exposes at least a portion of a top of the bonding pad PAD may be formed in the passivation layer 150. The bonding pad PAD may be connected to a signal bump BP-P through the hole 150H.

In the device region CR, the passivation layer 150 may cover all a top and a side of the third wiring M3. In the device region CR, a top of the passivation layer 150 may have a concave-convex shape that is consistently repeated like a surface shape of a wave.

A thermal bump BP-T that is disposed on the passivation layer 150 and covers the third wiring M3 may be provided in the device region CR. A plurality of the thermal bumps BP-T may be electrically insulated from the third wiring M3 by the passivation layer 150.

The signal bump BP-P and the thermal bump BP-T each may include a pillar layer 162 and a solder layer 164 disposed on the pillar layer 162.

A bottom 30B of the TSV structure 30 may be covered by a seed layer 64. A connection terminal 70 may be connected to the TSV structure 30 through the seed layer 64. A top surface 70T and at least a portion of a side wall 70S of the connection terminal 70 may be covered by a metal capping layer 80.

The connection terminal 70 is not limited to a shape illustrated in FIG. 7. In other example embodiments, the connection terminal 70 may have the form of a conductive pad, a solder ball, a solder bump, or a redistribution wiring conductive layer.

A process of forming the BEOL structure 140, a process of forming the seed layer 64, and a process of forming the connection terminal 70 may be performed after the TSV structure 30 is formed.

FIG. 8 is a cross-sectional view schematically illustrating a configuration of a semiconductor chip 10-2 according to an example embodiment. In providing description with reference to FIG. 8, details which are similar to or the same as the details described above with reference to FIG. 7 may be omitted, and like reference numerals refer to like elements.

Referring to FIG. 8, the semiconductor chip 10-2 may include a pad region PR and a device region CR. In the semiconductor chip 10-2, an FEOL structure 130 and a BEOL structure 140 may be formed, and then, a TSV structure 30 may be formed. Therefore, the TSV structure 30 may be formed to pass through a semiconductor substrate 120, an interlayer insulation layer 134 of the FEOL structure 130, and an inter-wiring insulation layer 148 of the BEOL structure 140. A conductive barrier layer 34 of the TSV structure 30 may include a first outer wall portion surrounded by the semiconductor substrate 120, a second outer wall portion surrounded by the interlayer insulation layer 134, and a third outer wall portion surrounded the inter-wiring insulation layer 148.

A bonding pad PAD may be provided between the TSV structure 30 and a signal bump BP-P on the BEOL structure 140, for electrically connecting the TSV structure 30 to the signal bump BP-P.

A bottom 30B of the TSV structure 30 may be covered by a seed layer 64. A connection terminal 70 may be connected to the TSV structure 30 through the seed layer 64. A portion of each of a top 70T and a side wall 70S of the connection terminal 70 may be covered by a metal capping layer 80.

FIG. 9 is a cross-sectional view schematically illustrating a configuration of a semiconductor chip 10-3 according to an example embodiment. In providing description with reference to FIG. 9, details which are similar to or the same as the details described above with reference to FIGS. 7 and 8 may be omitted, and like reference numerals refer to like elements.

Referring to FIG. 9, the semiconductor chip 10-3 may include a pad region PR and a device region CR. In the semiconductor chip 10-3, a TSV structure 30 may extend to pass through a semiconductor substrate 120. The TSV structure 30 may be formed, and then, an FEOL structure 130 and a BEOL structure 140 may be formed on the TSV structure 30 and the semiconductor substrate 120. The TSV structure 30 may be connected to a multilayer wiring structure 146 of the BEOL structure 140 through a conductive line 136 and a contact plug 138 which are included in the FEOL structure 130.

A bottom 30B of the TSV structure 30 may be covered by a seed layer 64. A connection terminal 70 may be connected to the TSV structure 30 through the seed layer 64. A portion of each of a top 70T and a side wall 70S of the connection terminal 70 may be covered by a metal capping layer 80.

In the semiconductor chips 10-1, 10-2 and 103 illustrated in FIGS. 7 to 9, the TSV structure 30 and the signal bump BP-P are illustrated as being arranged in a vertical direction, but are not limited thereto. In other example embodiments, the signal bump BP-P may be provided to be shifted in a horizontal direction.

FIGS. 10 to 15 are cross-sectional views illustrating a method of manufacturing a semiconductor chip according to an example embodiment.

Figure 10:
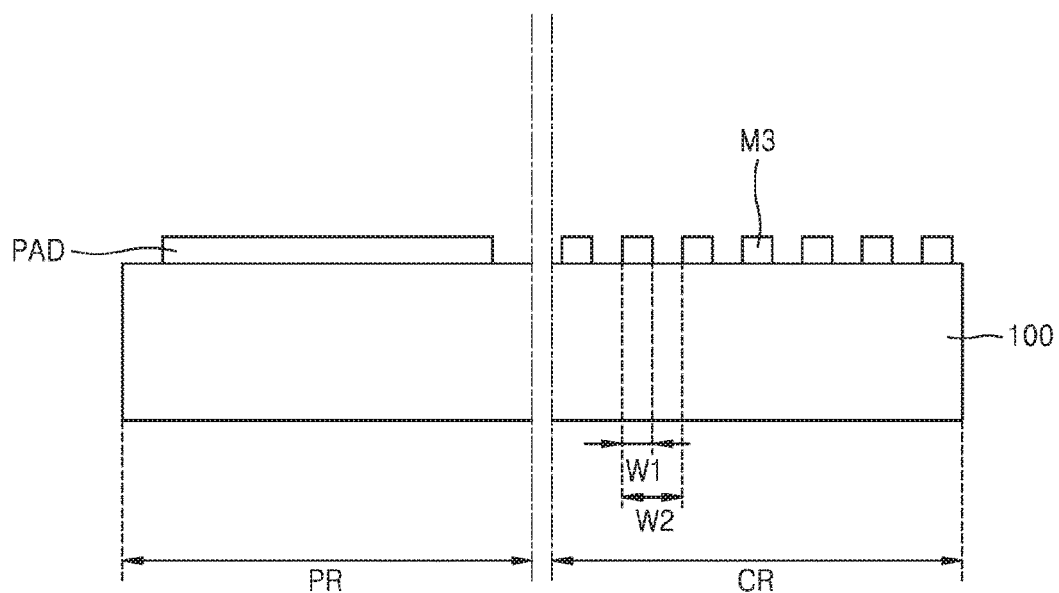
FIGS. 10, 11, 12, 13, 14, and 15 are cross-sectional views illustrating a method of manufacturing a semiconductor chip according to an example embodiment.

Referring to FIG. 10, a semiconductor device layer 100 may be prepared. The semiconductor device layer 100, for example, may be formed like the semiconductor devices 100-1, 100-2 and 100-3 of the semiconductor chips 10-1, 10-2 and 103 illustrated in FIGS. 7 to 9.

A bonding pad PAD and an uppermost wiring M3 may be respectively formed in a pad region PR and a cell region CR on the semiconductor device layer 100. The bonding pad PAD and the uppermost wiring M3 may be formed together and may configure the same layer. In some example embodiments, the bonding pad PAD and the uppermost wiring M3 may be formed to have a thickness of hundreds nm to several rm. The bonding pad PAD and the uppermost wiring M3 each may be formed of metal. For example, the bonding pad PAD and the uppermost wiring M3 may each be formed of one or more of Al, Cu, Ta, Ti, or W.

Hundreds to thousands of the bonding pads PAD, as illustrated in FIG. 1, may be arranged to form a matrix in the pad region PR. The bonding pads PAD may be arranged at a certain pitch of tens μm in a column direction and at a certain pitch of tens μm in a row direction to form the matrix. For example, the bonding pads PAD may be arranged at a pitch of 40 μm to 50 μm in the column direction or the row direction to form the matrix. For example, the bonding pads PAD may have a tetragonal shape having a side length of 20 μm to 40 μm.

A plurality of the uppermost wirings M3 may extend in parallel along one direction in the cell region CR. The plurality of uppermost wirings M3 may have the same width, namely, a first width W1, and may be arranged at an equal distance. The plurality of uppermost wirings M3 may be arranged at a pitch equal to a second width W2.

For example, a wiring material layer may be formed, and then, the bonding pad PAD and the uppermost wiring M3 may be formed by patterning the wiring material layer through a photo process and an etching process.

Figure 11:
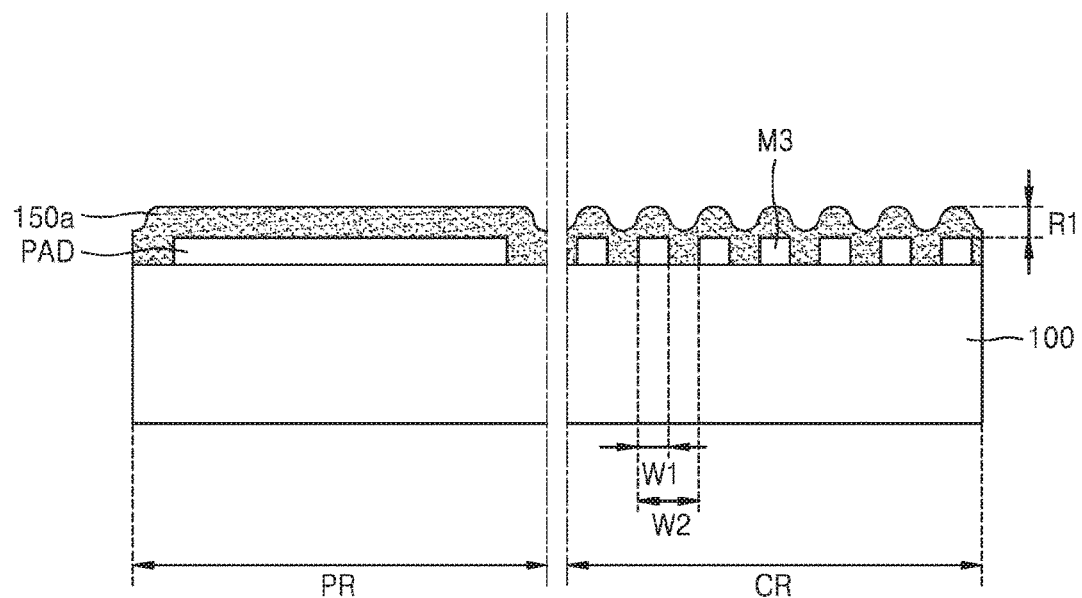

Referring to FIG. 11, a preliminary passivation layer 150a that covers the bonding pad PAD and the uppermost wiring M3 may be formed. The preliminary passivation layer 150a may be formed of an inorganic insulating material. In some example embodiments, the preliminary passivation layer 150a may be formed of silicon nitride.

The preliminary passivation layer 150a may have a thickness of hundreds nm to several μm. A shape of each of the plurality of uppermost wirings M3 may be partially transferred to a top of the preliminary passivation layer 150a, and a top of the preliminary passivation layer 150a may have a first step height R1. In some example embodiments, the top of the preliminary passivation layer 150a may have a concave-convex shape which is consistently repeated like a wave shaped surface, and the first step height R1 may be a height between a top and a bottom of a wave shape of the top of preliminary passivation layer 150a. The first step height R1 may have a value equal to or less than 100 nm.

Figure 12:
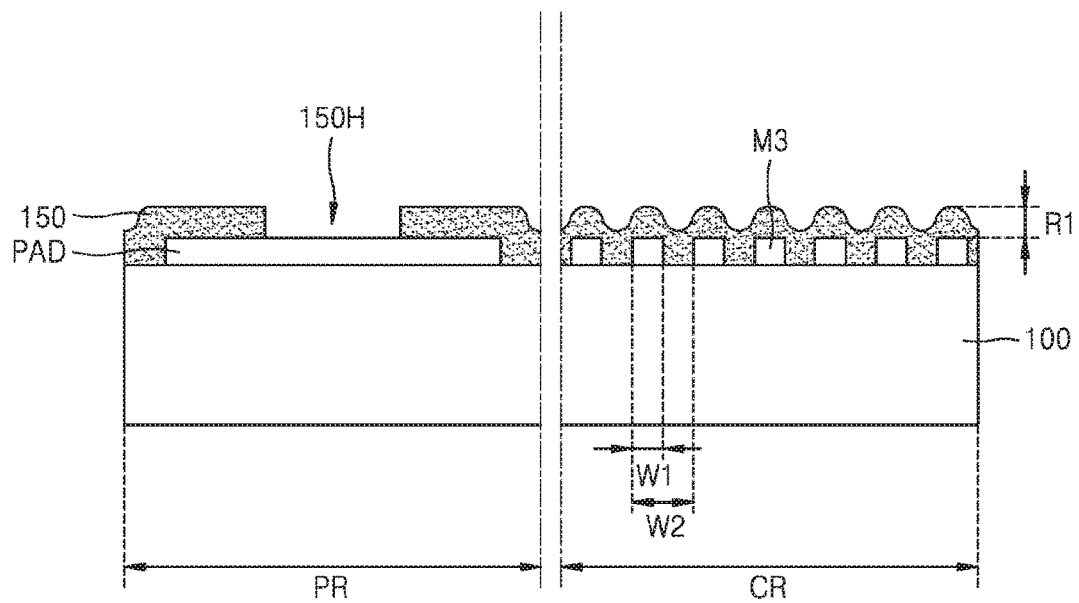

Referring to FIGS. 11 and 12, a passivation layer 150 that includes a bump hole 150H exposing at least a portion of a top of the bonding pad PAD may be formed by removing a portion of the preliminary passivation layer 150a. The passivation layer 150 may entirely cover top and side surfaces of each of the plurality of the uppermost wirings M3 in the cell region CR.

Figure 13:
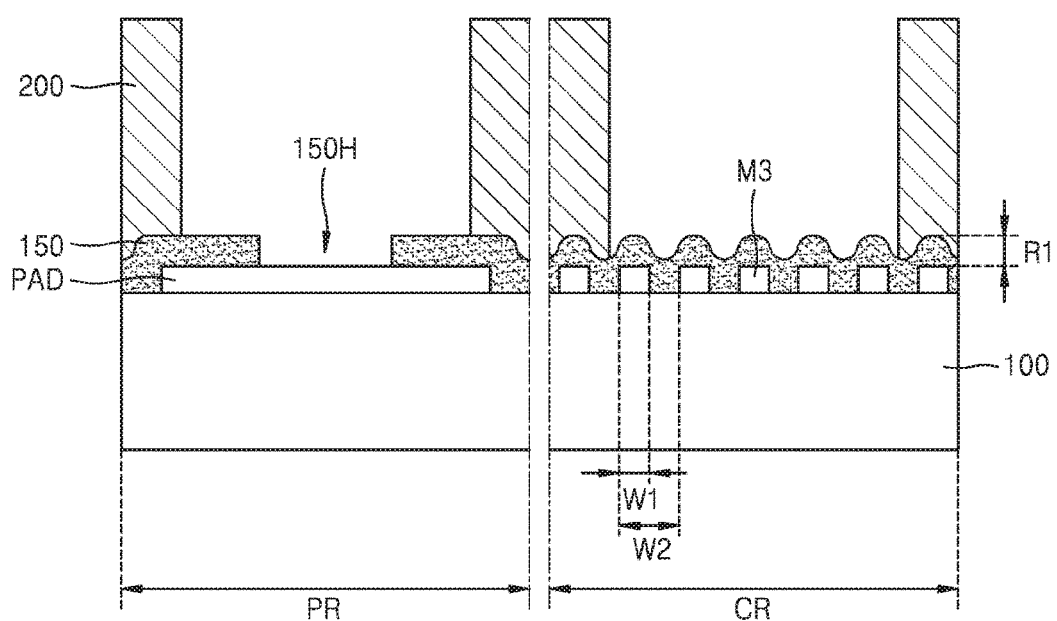

Referring to FIG. 13, a mask pattern 200 may be formed on the passivation layer 150.

The mask pattern 200 may expose the bump hole 150H and a portion of the passivation layer 150 adjacent to the bump hole 150H in the pad region PR. That is, the mask pattern 200 may expose at least a portion of the top of the bonding pad PAD in the pad region PR. The mask pattern 200 may expose a portion of the passivation layer 150 in the cell region CR.

A wavelength of light applied to a photolithography process of forming the mask pattern 200 may have a value which is four or more times greater than the first step height R1 that is a step height of a concave-convex shape of a top surface of the passivation layer 150, in the cell region CR.

On the other hand, the top surface of the passivation layer 150 may be formed to have a step height having a value corresponding to one-fourth or less of the wavelength of the light applied to the photolithography process of forming the mask pattern 200.

In some example embodiments, the photolithography process of forming the mask pattern 200 may be performed by exposing light having a wavelength of 435 nm (g-line) or 405 nm (h-line), and the first step height R1 may have a value equal to or less than 100 nm.

When the first step height R1 of the top of the passivation layer 150 has a value corresponding to one-fourth or less of the wavelength of the light applied to the photolithography process of forming the mask pattern 200, diffuse reflection is mitigated or prevented from occurring in photo exposure for forming the mask pattern 200. Accordingly, a shape of the mask pattern 200 is mitigated or prevented from being abnormally formed in the cell region CR. Here, the shape of the mask pattern 200 being abnormal refers to situations, for example, that the width or area of the passivation layer 150 exposed by the mask pattern 200 is formed to have an unintended shape, or a curve is formed on an inner wall of the mask pattern 200 exposing the passivation layer 150.

Therefore, when the first step height R1 of the top surface of the passivation layer 150 has a value corresponding to one-fourth or less of the wavelength of the light applied to the photolithography process of forming the mask pattern 200, the width or area of the passivation layer 150 exposed by the mask pattern 200 is formed to have an intended shape, and a curve is not formed on the inner wall of the mask pattern 200 exposing the passivation layer 150.

Figure 14:
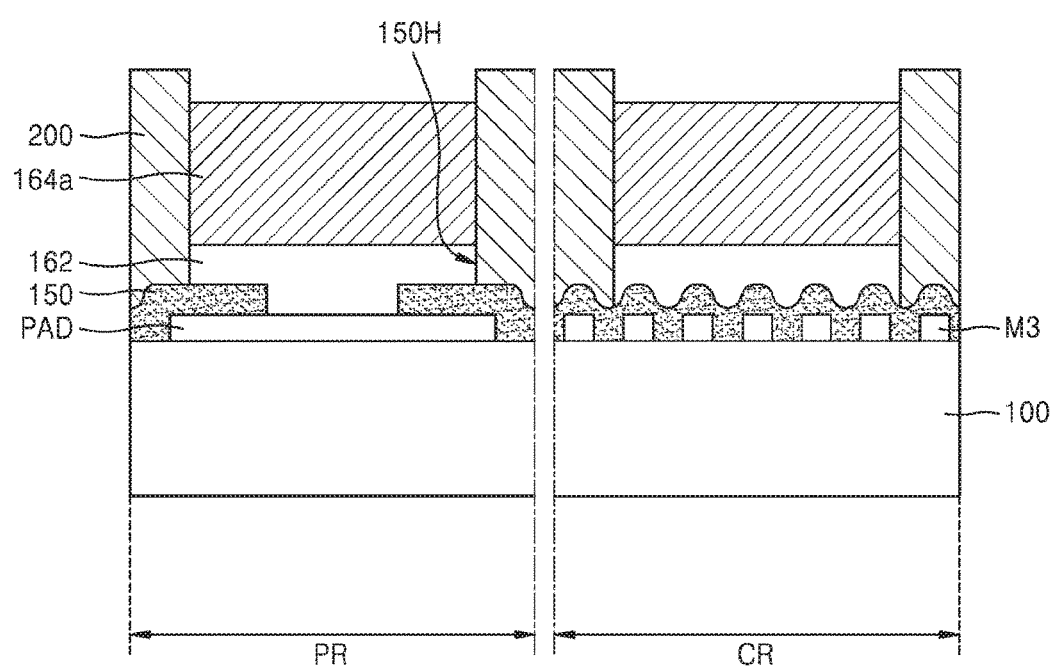

Referring to FIG. 14, a pillar layer 162 and a preliminary solder layer 164a may be sequentially formed on a portion of the bonding pad PAD and a portion of the passivation layer 150 exposed by the mask pattern 200.

The pillar layer 162 may be formed of, for example, Cu, Ni, Au, and/or the like. The pillar layer 162, for example, may be formed of one metal selected from among Cu, Ni, and Au or an alloy thereof or may have a multilayer structure including a plurality of metals selected from among Cu, Ni, and Au. The pillar layer 162 may be formed through an electroplating process.

After the pillar layer 162 is formed, the preliminary solder layer 164a may be formed on the pillar layer 162. The preliminary solder layer 164a may include an alloy of tin (Sn) and silver (Ag), and depending on the case, Cu, palladium (Pd), bismuth (Bi), antimony (Sb), and/or the like may be added into the preliminary solder layer 164a. The preliminary solder layer 164a may be formed through an electroplating process.

Figure 15:
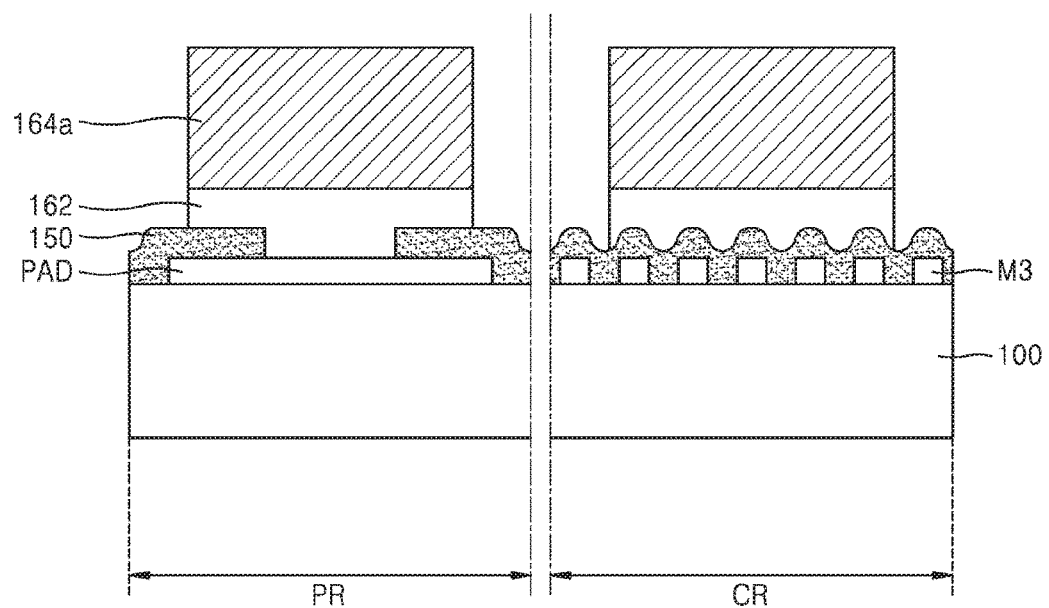

Referring to FIGS. 14 and 15, the pillar layer 162 and the preliminary solder layer 164a may be formed, and then, the mask pattern 200 may be removed. Subsequently, a semiconductor chip 10 including a solder layer 164 having a convex shape as illustrated in FIG. 3 may be formed by reflowing the preliminary solder layer 164a through thermal treatment.

Referring to FIGS. 3 and 10 to 15, in a method of manufacturing a semiconductor chip according to an example embodiment, a plurality of uppermost wirings M3 which have the same width and are arranged at an equal distance may be formed in the cell region CR, thereby reducing the first step height R1 of the top of the passivation layer 150 covering the plurality of uppermost wirings M3. Therefore, diffuse reflection is mitigated or prevented from occurring in photo exposure, and thus, upper ends of a signal bump BP-S and a thermal bump BP-T included in the semiconductor chip 10 may have the same level. Accordingly, a contact defect may be mitigated or prevented from occurring in the signal bump BP-S and the thermal bump BP-T, thereby securing reliability of the semiconductor chip 10 and efficiently dissipating heat generated from the semiconductor chip 10.

Figure 16:
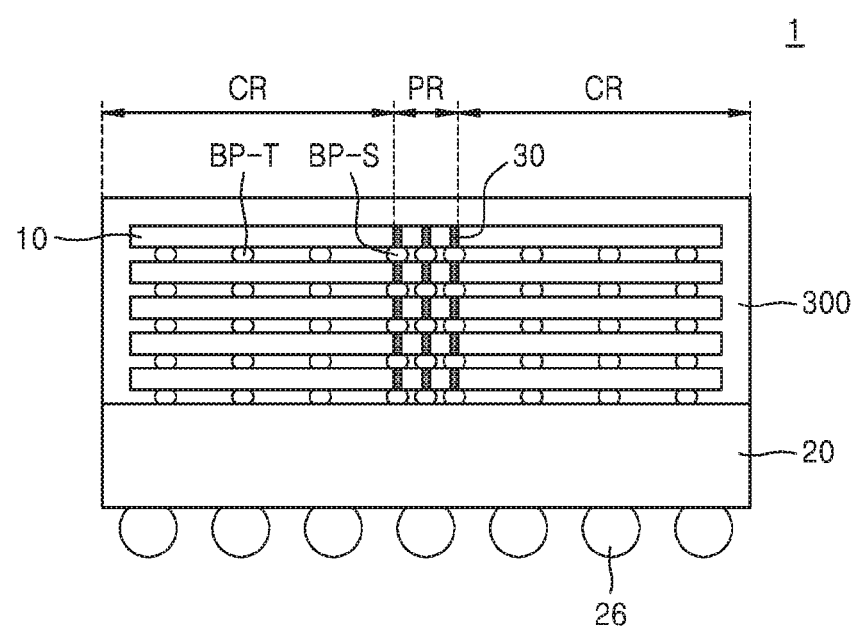
FIG. 16 is a cross-sectional view illustrating a semiconductor package including a semiconductor chip according to an example embodiment.

FIG. 16 is a cross-sectional view illustrating a semiconductor package 1 including a semiconductor chip according to an example embodiment.

Referring to FIG. 16, the semiconductor package 1 may include a plurality of semiconductor chips 10 which are sequentially stacked on a package substrate 20. The plurality of semiconductor chips 10 may be stacked in a vertical direction. In FIG. 16, the semiconductor package 1 is illustrated as including five semiconductor chips 10, but is not limited thereto. In other example embodiments, the semiconductor package 1 may include two to four semiconductor chips 10 or six or more semiconductor chips 10.

Each of the plurality of semiconductor chips 10 may include a plurality of TSV structures 30. The plurality of TSV structures 30 may be provided in the pad region PR. The plurality of semiconductor chips 10 may be electrically connected to each other by connecting corresponding TSV structures 30. The plurality of semiconductor chips 10 may be electrically connected to the package substrate 20 through the plurality of TSV structures 30.

The package substrate 20 may be, for example, a printed circuit board, a ceramic substrate, or an interposer. When the package substrate 20 is the printed circuit board, the package substrate 20 may include a substrate base, a top pad (not shown) provided on a top of the substrate base, and a bottom pad (not shown) provided on a bottom of the substrate base. The top pad and the bottom pad may be exposed by a solder resist layer (not shown) that covers the top and bottom of the substrate base. The substrate base may be formed of at least one of phenol resin, epoxy resin, and polyimide. For example, the substrate base may include at least one material selected from among FR4, tetrafunctional epoxy, polyphenylene ether, epoxy/polyphenylene oxide, bismaleimide triazine (BT), thermount, cyanate ester, polyimide, and liquid crystal polymer. The top pad and the bottom pad may each be formed of Cu, Ni, stainless steel, beryllium copper, and/or the like. An internal wiring (not shown) electrically connected to the top pad and the bottom pad may be provided in the substrate base. The top pad and the bottom pad may be portions of circuit wirings, which are formed by patterning Cu foils coated on the top and bottom of the substrate base, exposed by the solder resist layer.

When the package substrate 20 is an interposer, the package substrate 20 may include a substrate base formed of a semiconductor material, a top pad (not shown) provided on a top of the substrate base, and a bottom pad (not shown) provided on a bottom of the substrate base. The substrate base may be formed from, for example, a silicon wafer. Also, an internal wiring (not shown) may be formed on the top, bottom, or inside of the substrate base. Also, a through via (not shown) that electrically connects the top pad to the bottom pad may be formed in the inside of the substrate base.

An external connection terminal 26 may be attached to the bottom of the package substrate 20. The external connection terminal 26, for example, may be attached to the bottom pad. The external connection terminal 26 may be, for example, a solder ball or a bump. The external connection terminal 26 may electrically connect the semiconductor package 1 to an external device.

A mold layer 300 surrounding some or all of the plurality of semiconductor chips 10 may be formed on the package substrate 20. The mold layer 300 may be formed of, for example, an epoxy mold compound (EMC).

In some example embodiments, the mold layer 300 may expose a top of an uppermost semiconductor chip 10 among the plurality of semiconductor chips 10, and a heat dissipating member (not shown) may be attached to the mold layer 300 and the plurality of semiconductor chips 10 with a thermal interface material (TIM) therebetween.

The TIM may be formed of an insulating material, or may be formed of the insulating material and a material for maintaining electrical insulating properties. The TIM may include, for example, epoxy resin. The TIM may be, for example, mineral oil, grease, gap filler putty, phase change gel, phase change material pads, particle filled epoxy, and/or the like.

The heat dissipating member may be, for example, heat sink, heat spreader, heat pipe, or liquid cooled cold plate.

The signal bump BP-S connected to the TSV structure 30 may be provided on a bottom of each of the plurality of semiconductor chips 10 in the pad region PR. The thermal bump BP-T may be provided on a bottom of each of the plurality of semiconductor chips 10 in the cell region CR. The plurality of semiconductor chips 10 may be supported by the signal bump BP-S and the thermal bump BP-T. The thermal bump BP-T may be electrically insulated from a plurality of individual devices configuring a semiconductor device included in the semiconductor chip 10.

Each of the plurality of semiconductor chips 10 may be at least one of the semiconductor chips 10, 10a, 10b, 10c, 10-1, 10-2 and 10-3 of FIGS. 1 to 15 or a combination thereof.

In the semiconductor package 1 according to an example embodiment, upper ends of the signal bump BP-S and the thermal bump BP-T may have the same level, and a warpage may be mitigated or prevented from occurring in the semiconductor chips 10. Accordingly, a contact defect may be mitigated or prevented from occurring in the signal bump BP-S and the thermal bump BP-T, thereby securing reliability of the semiconductor package 1 and efficiently dissipating heat generated from the semiconductor chips 10.

Figure 17:
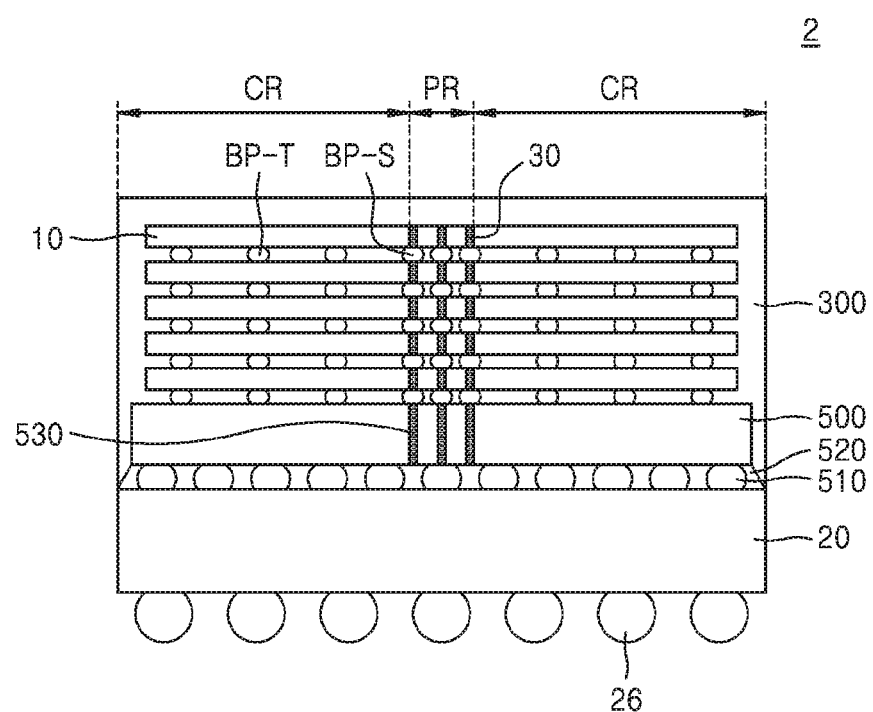
FIG. 17 is a cross-sectional view illustrating a semiconductor package including a semiconductor chip according to an example embodiment.

FIG. 17 is a cross-sectional view illustrating a semiconductor package 2 including a semiconductor chip according to an example embodiment.

Referring to FIG. 17, the semiconductor package 2 may include a main semiconductor chip 500 attached to a package substrate 20 and a plurality of semiconductor chips 10 which are sequentially stacked on the main semiconductor chip 500.

The semiconductor package 2 illustrated in FIG. 17 may be configured in a form where the main semiconductor chip 500 is further included in the semiconductor package 1 illustrated in FIG. 16, and thus, details which are similar to or the same as the details described above with reference to FIG. 16 are not described.

The main semiconductor chip 500 may be a processor unit. The main semiconductor chip 500 may be, for example, a microprocessor unit (MPU) or a graphic processor unit (GPU). In some example embodiments, the main semiconductor chip 500 may be a package (i.e., a known good package (KGP)) for which a normal operation has been verified. The main semiconductor chip 500 may include a main TSV structure 530. The main TSV structure 530 may have a structure similar to the TSV structure 30 included in the semiconductor chip 10, and thus, its detailed description is not provided.

The TSV structure 30 of each of the plurality of semiconductor chips 10 may be electrically connected to the main TSV structure 530 of the main semiconductor chip 500 corresponding thereto.

A main connection terminal 510 may be attached to a bottom of the main semiconductor chip 500. The plurality of semiconductor chips 10 and the main semiconductor chip 500 may be electrically connected to the package substrate 20 through the main connection terminal 510. In some example embodiments, an under-fill material layer 520 surrounding the main connection terminal 510 may be further formed between the main semiconductor chip 500 and the package substrate 20. The under-fill material layer 520 may be formed of, for example, epoxy resin. In some example embodiments, the under-fill material layer 520 may be a portion of the mold layer 300 which is formed in a molded under-fill (MUF) method.

Each of the plurality of semiconductor chips 10 may be at least one of the semiconductor chips 10, 10*a*, 10*b*, 10*c*, 10-1, 10-2 and 10-3 of FIGS. 1 to 15 or a combination thereof.

In the semiconductor package 2 according to an example embodiment, upper ends of a signal bump BP-S and a thermal bump BP-T may have the same level, and a warpage may be mitigated or prevented from occurring in the semiconductor chips 10. Accordingly, a contact defect may be mitigated or prevented from occurring in the signal bump BP-S and the thermal bump BP-T, thereby securing reliability of the semiconductor package 2 and efficiently dissipating heat generated from the semiconductor chips 10 included in the semiconductor package 2.

Figure 18:
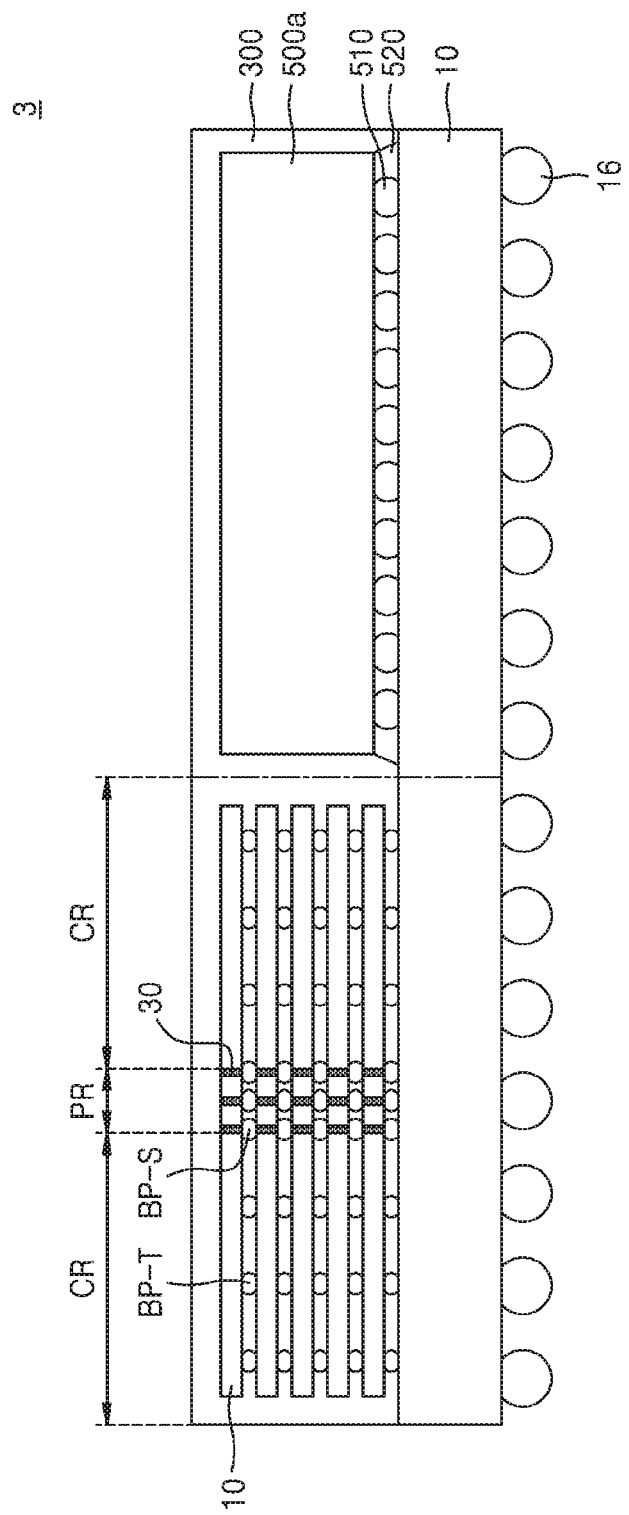
FIG. 18 is a cross-sectional view illustrating a semiconductor package including a semiconductor chip according to an example embodiment.

FIG. 18 is a cross-sectional view illustrating a semiconductor package 3 including a semiconductor chip according to an example embodiment.

Referring to FIG. 18, the semiconductor package 3 may include a main semiconductor chip 500*a* attached to a package substrate 20 and a plurality of semiconductor chips 10 which are sequentially stacked on the package substrate 20.

Except that the main semiconductor chip 500*a* and the sequentially stacked plurality of semiconductor chips 10 are attached to different portions of the package substrate 20, the semiconductor package 3 illustrated in FIG. 18 may be similar to the semiconductor package 2 illustrated in FIG. 17, and thus, its detailed description is not provided.

In the semiconductor package 3 according to an example embodiment, upper ends of a signal bump BP-S and a thermal bump BP-T may have the same level, and a warpage may be mitigated or prevented from occurring in the semiconductor chips 10. Accordingly, a contact defect may be mitigated or prevented from occurring in the signal bump BP-S and the thermal bump BP-T, thereby securing reliability of the semiconductor package 3 and efficiently dissipating heat generated from the semiconductor chips 10 included in the semiconductor package 3.

Figure 19:
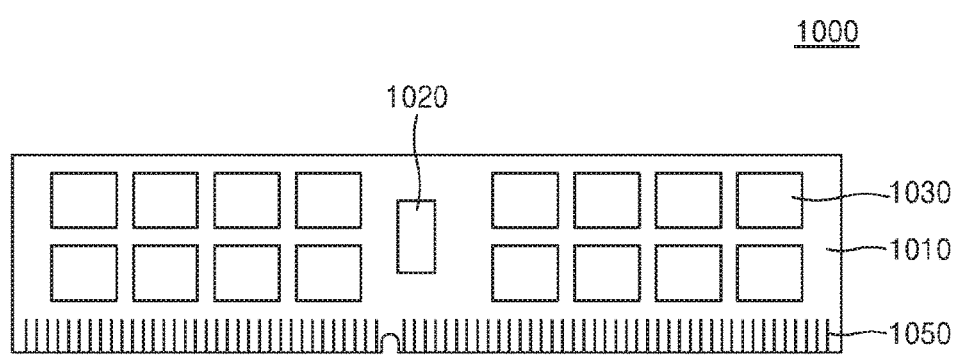
FIG. 19 is a plan view illustrating a configuration of a main part of a semiconductor module according to an example embodiment.

FIG. 19 is a plan view illustrating a configuration of a main part of a semiconductor module 1000 according to an example embodiment.

Referring to FIG. 19, the semiconductor module 1000 may include a module substrate 1010, a control chip 1020, and a plurality of semiconductor packages 1030. The control chip 1020 and the plurality of semiconductor packages 1030 may be mounted on the module substrate 1010. A plurality of input/output (I/O) terminals 1150 may be provided on the module substrate 1010.

Each of the plurality of semiconductor packages 1030 may include at least one of the semiconductor chips 10, 10*a*, 10*b*, 10*c*, 10-1, 10-2 and 10-3 of FIGS. 1 to 15 or a combination thereof.

Figure 20:
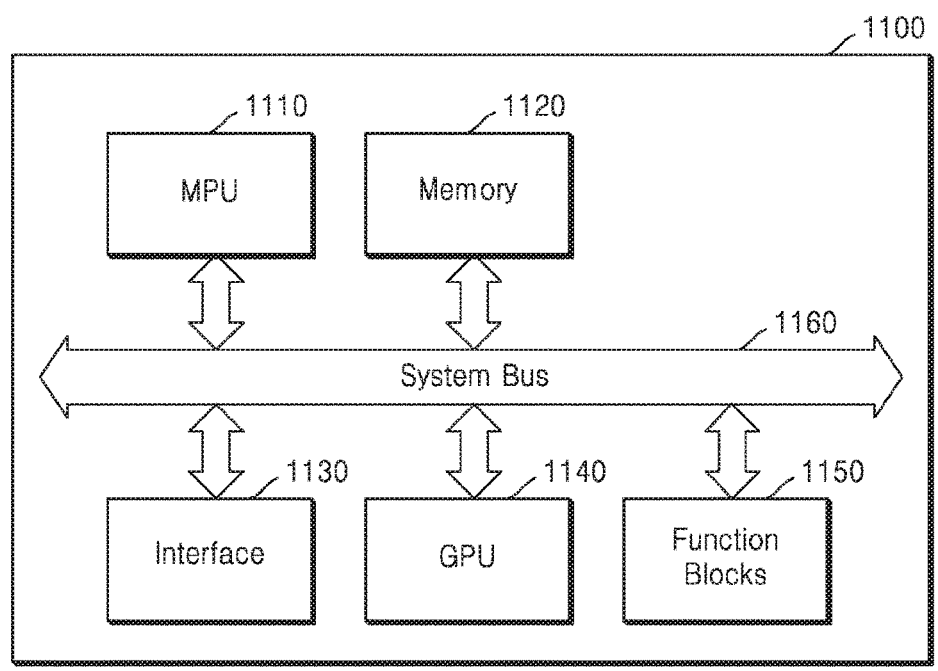
FIG. 20 is a diagram schematically illustrating a configuration of a semiconductor package according to an example embodiment.

FIG. 20 is a diagram schematically illustrating a configuration of a semiconductor package 1100 according to an example embodiment.

Referring to FIG. 20, the semiconductor package 1100 may include a MPU 1110, a memory 1120, an interface 1130, a GPU 1140, a plurality of function blocks 1150, and a bus 1160 connecting the elements. The semiconductor package 1100 may include all of the MPU 110 and the GPU 1140, or may include only one of the MPU 110 or the GPU 1140.

The MPU 1110 may include a core and an L2 cache. For example, the MPU 1110 may include a multi-core. Cores of the multi-core may have the same performance or different performances. Also, the cores of the multi-core may be activated at the same time or at different times. The memory 1120 may store a result of processing which is performed by each of the function blocks 1150 according to control by the MPU 1110. For example, when details stored in the L2 cache of the MPU 1110 are flushed, the processing result may be stored in the memory 1130. The interface 1130 may perform an interface with external devices. For example, the interface 1130 may perform an interface with a camera, a liquid crystal display (LCD), a speaker, and/or the like.

The GPU 1140 may perform graphic functions. For example, the GPU 1140 may perform video codec or may process three-dimensional (3D) graphic.

The function blocks 1150 may perform various functions. For example, when the semiconductor package 1100 is an AP applied to mobile devices, some of the function blocks 1150 may perform a communication function.

Each of the plurality of semiconductor packages 1100 may include at least one of the semiconductor chips 10, 10*a*, 10*b*, 10*c*, 10-1, 10-2 and 10-3 of FIGS. 1 to 15 or a combination thereof or may be one of the semiconductor packages 1, 2 and 3 of FIGS. 16 to 18.

Figure 21:
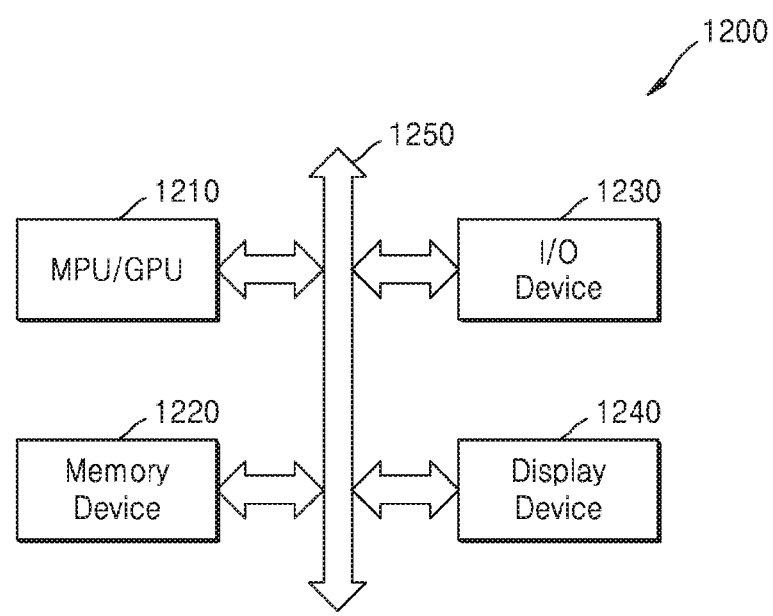
FIG. 21 is a diagram illustrating an electronic system including a semiconductor package according to an example embodiment.

FIG. 21 is a diagram illustrating an electronic system 1200 including a semiconductor package according to an example embodiment.

Referring to FIG. 21, the electronic system 1200 may be equipped with a MPU/GPU 1210. The electronic system 1200 may be, for example, a mobile device, a desktop computer, a server, or the like. Also, the electronic system 1200 may further include a memory device 1220, an input/output (I/O) device 1230, and a display device 1240, and the elements may be electrically connected to a bus 1250. The MPU/GPU 1210 and memory device 1220 may include at least one of the semiconductor chips 10, 10*a*, 10*b*, 10*c*, 10-1, 10-2 and 10-3 of FIGS. 1 to 15 or a combination thereof or may be one of the semiconductor packages 1, 2 and 3 of FIGS. 16 to 18.

In the semiconductor chips, the semiconductor packages including the same, and the methods of manufacturing the semiconductor chip according to the described example embodiments, a plurality of uppermost wirings may have the same width and may be arranged at an equal distance, and a top of a passivation layer may have a concave-convex shape which is consistently repeated like a wave shaped surface, thereby mitigating or preventing diffuse reflection from occurring in a photolithography process of forming a bump which includes a signal bump and a thermal bump.

Accordingly, a shape of the bump may be mitigated or prevented from being formed.

Further, according to the described example embodiments, the semiconductor chip may avoid separately using a protection layer to counteract a step height of the top of the passivation layer. Accordingly, a warpage may be mitigated or prevented from occurring in the semiconductor chip. Further, an upper end of the signal bump and an upper end of the thermal bump may have the same level, thereby mitigating or preventing a contact defect from occurring in the signal bump and the thermal bump. Accordingly, reliability of the semiconductor chip and the semiconductor package including the same is secured, and heat generated from the semiconductor chip is efficiently dissipated.

While the inventive concepts have been particularly shown and described with reference to some example embodiments thereof, it will be understood that various changes in form and details may be made therein without departing from the spirit and scope of the following claims.

What is claimed is:

1. A semiconductor chip comprising:
   a semiconductor device layer including a pad region and a cell region, the semiconductor device layer including a plurality of through silicon via (TSV) structures in the pad region;
   a plurality of uppermost wirings on the semiconductor device layer, the plurality of uppermost wirings arranged at an equal distance in the cell region, the plurality of uppermost wirings having a same width and extending in parallel along one direction;
   a passivation layer in the cell region and the pad region, the passivation layer covering at least a top surface of the plurality of uppermost wirings in the cell region, the top surface of the passivation layer in the cell region having a wave shape; and
   a plurality of thermal bumps on the passivation layer, the plurality of thermal bumps electrically insulated from the plurality of uppermost wirings.

2. The semiconductor chip of claim 1, further comprising:
   a plurality of pads on the semiconductor device layer, the plurality of pads connected to the plurality of TSV structures in the pad region; and
   a plurality of signal bumps on the plurality of pads, the plurality of signal bumps electrically connected to the plurality of pads.

3. The semiconductor chip of claim 2, wherein
   the passivation layer further covers a top surface of the plurality of uppermost wirings in the pad region, and includes a bump hole exposing a portion of a top surface of each of the plurality of pads, and
   each of the plurality of signal bumps is connected to a respective one of the plurality of pads through the bump hole.

4. The semiconductor chip of claim 2, wherein an upper end of each of the plurality of signal bumps and an upper end of each of the plurality of thermal bumps have a same level.

5. The semiconductor chip of claim 2, wherein the plurality of signal bumps and the plurality of thermal bumps have a same horizontal width.

6. The semiconductor chip of claim 2, wherein
   the plurality of signal bumps are arranged at a first pitch, and
   the plurality of thermal bumps are arranged at a second pitch greater the first pitch.

7. The semiconductor chip of claim 1, wherein the passivation layer comprises an inorganic insulating material.

8. The semiconductor chip of claim 1, wherein at least two adjacent upper wirings of the plurality of uppermost wirings are electrically connected to each other to function as one wiring.

9. The semiconductor chip of claim 8, wherein at least a portion of each of the at least two adjacent uppermost wirings extends under at least one of the plurality of thermal bumps.

10. The semiconductor chip of claim 8, wherein the at least two adjacent uppermost wirings are configured to transfer at least one of a power signal or a ground signal.

11. The semiconductor chip of claim 1, wherein a step height of the top surface of the passivation layer in the cell region is 100 nm or less.

12. The semiconductor chip of claim 10, wherein a width of each of the plurality of uppermost wirings in the cell region is 200 nm to 500 nm.

13. The semiconductor chip of claim 1, wherein a bottom surface of each of the plurality of thermal bumps has a wave shape corresponding to the top surface of the passivation layer.

14. A semiconductor chip including a pad region and a cell region, the semiconductor chip comprising:
   a plurality of through silicon via (TSV) structures in the pad region;
   a plurality of uppermost wirings in the cell region, the plurality of uppermost wirings forming part of circuit configurations of the semiconductor chip, adjacent ones of the plurality of uppermost wirings being spaced apart by a same distance, each of the plurality of uppermost wirings having a same width, the plurality of uppermost wirings extending in parallel along one direction;
   a passivation layer in the cell region and the pad region, the passivation layer covering at least a top surface of the plurality of uppermost wirings in the cell region, a top surface of the passivation layer in the cell region having a wave shape; and
   a plurality of thermal bumps on the passivation layer, the plurality of thermal bumps electrically insulated from the plurality of uppermost wirings.

15. The semiconductor chip of claim 14, wherein the plurality of uppermost wirings do not include redistribution wirings, which are provided to make available at least some of the plurality of pads in other locations.

16. The semiconductor chip of claim 14, further comprising:
   a plurality of pads on the semiconductor device layer in the pad region, the plurality of pads connected to the plurality of TSV structures in the pad region; and
   a plurality of signal bumps on the plurality of pads, the plurality of signal bumps electrically connected to the plurality of pads.

17. The semiconductor chip of claim 16, wherein an upper end of each of the plurality of signal bumps and an upper end of each of the plurality of thermal bumps have a same level.

18. The semiconductor chip of claim 14, wherein
   the passivation layer further covers a top surface of the plurality of uppermost wirings in the pad region, and includes a bump hole exposing a portion of a top surface of each of the plurality of pads, and
   each of the plurality of signal bumps is connected to a respective one of the plurality of pads through the bump hole.

19. The semiconductor chip of claim 14, wherein at least two adjacent upper wirings of the plurality of uppermost wirings are electrically connected to each other to function as one wiring.

20. The semiconductor chip of claim 19, wherein at least a portion of each of the at least two adjacent uppermost wirings extends under at least one of the plurality of thermal bumps.

* * * * *